United States Patent [19]

Hendrickson

[11] 4,256,977
[45] Mar. 17, 1981

[54] ALTERNATING POLARITY POWER SUPPLY CONTROL APPARATUS

[75] Inventor: Thomas E. Hendrickson, Wayzata, Minn.

[73] Assignee: Honeywell Inc., Minneapolis, Minn.

[21] Appl. No.: 973,215

[22] Filed: Dec. 26, 1978

[51] Int. Cl.³ .................... H03K 17/60; H01L 29/72
[52] U.S. Cl. .................................. 307/571; 307/279; 307/304
[58] Field of Search ............... 307/251, 279, 304, 268; 357/22, 23

[56] References Cited

U.S. PATENT DOCUMENTS

| 3,112,410 | 11/1963 | Schmid | 307/254 |
|---|---|---|---|
| 3,131,312 | 4/1964 | Patzrath | 307/251 |
| 3,348,062 | 10/1967 | Carlson et al. | 307/251 |
| 4,148,046 | 4/1979 | Hendrickson et al. | 357/22 |
| 4,148,047 | 4/1979 | Hendrickson et al. | 357/23 |
| 4,152,714 | 5/1979 | Hendrickson et al. | 357/22 |

*Primary Examiner*—Stanley D. Miller, Jr.
*Assistant Examiner*—B. P. Davis
*Attorney, Agent, or Firm*—Theodore F. Neils

[57] ABSTRACT

An electronic switching circuit is provided for controlling transfer of electrical power from an alternating polarity electrical power supply to a load means through use of a field-effect transistor device as the primary power controlling element.

58 Claims, 13 Drawing Figures

ALTERNATING POLARITY POWER SUPPLY CONTROL APPARATUS

Reference is hereby made to copending applications by B. H. Pinckaers entitled "Alternating Polarity Power Supply Control Apparatus" having Ser. No. 973,216, and by T. E. Hendrickson and T. C. Spindler entitled "Alternating Polarity Power Supply Control Apparatus" having Ser. No. 973,463, which were all filed on even date with the present application and which are all assigned to the same assignee as the present application. Reference is also made to earlier filed copending applications, all assigned to the same assignee, by T. E. Hendrickson entitled "Semiconductor Apparatus" having Ser. No. 869,981, by T. E. Hendrickson, et al., entitled "Semiconductor Apparatus" having Ser. No. 869,980, and T. E. Hendrickson, et al., entitled "Semiconductor Apparatus" having Ser. No. 869,977.

BACKGROUND OF THE INVENTION

The present invention is related to circuits in which a field-effect transistor device controls power transfer from an alternating polarity electrical power supply to a load means, particularly when such field-effect transistor devices are capable of being integrated in monolithic integrated circuits, or when a plurality of same are used in series.

Various solid state devices have been used in circuits as the primary means for controlling power transfer from an alternating polarity electrical power supply to whatever kind of load means is of interest for use in the circuit. For instance, planar bipolar power transistors have been used but these are devices which are not bidirectional by nature and which exhibit an inherent, more or less irreducible, minimum power dissipation characteristic even when fully switched on. And to be fully switched on, bipolar power transistors require a substantial amount of base current, i.e., control current, especially for higher collector, or load, currents. Furthermore, they are also subject by nature to thermal runaway.

Perhaps more commonly used for controlling alternating polarity power supplies are thyristors of various kinds such as silicon controlled rectifiers and triacs. Such thyristors are switching devices primarily used in alternating polarity power supply control circuits because of their capability for handling relatively large power dissipations when switched fully on, and for withstanding substantial reverse voltages when switched fully off. An advantage of these devices over bipolar power transistors is that they require little electrical power at device control gates whether operating in the off condition or in the on condition.

However, such thyristors also have several disadvantages such as being a latching switch, that is, operating only in fully on or fully off states. Further, thyristor devices can be switched off by sufficiently reducing the current therethrough, and can be switched on by sharp voltage transients thereacross—both results being obtained without any action taking place at the control terminal of the thyristor device. Hence, the control terminal of the thyristor has relatively little continuous control capability. This same control terminal, in many situations, cannot be electrically isolated simply and inexpensively from the load circuit and may require large triggering currents to switch on the thyristor device. Finally, a thyristor device cannot be easily provided in a monolithic integrated circuit with other circuit components because of its structure and power dissipation.

Hence, better primary power controlling devices are desired for use in controlling power transfer from alternating polarity electrical power supplies in alternating polarity operated circuits. Particularly useful would be a device which could be easily provided in a monolithic integrated circuit along with other circuit components, at least some of which would also be used in controlling power transfer from the alternating polarity power supply used. This would require that such a device not have too large a resistance if switched fully on, despite substantial current loads, but which would have a structure easily fabricated in such an integrated circuit. Further, the device should have a bidirectional current conduction capability for circuits in which current rectification is not desired.

Field-effect transistor devices can have many of the characteristics just described, including having a very symmetrical bidirectional current conducting capability when on. This is certainly so for metal-oxide-semiconductor field-effect transistor (MOSFET) devices which have the advantage of having the gates therein very well isolated from the channel regions of the device. This isolation aids in providing a circuit to operate the field-effect transistor device when both the circuit and these devices are formed in a monolithic integrated circuit chip, a difficult arrangement when the integrated circuit is to operate with an alternating polarity power supply. Such circuits must permit the operation of other circuit component devices in the monolithic integrated circuit while also controlling power transfers from the alternating polarity power supply through operating the primary power transfer control field-effect device.

Electronic component device theory shows that field-effect transistors are operated by controlling the voltage appearing between the gate thereof and the connection to that one of the two channel regions therein which is effectively serving as the transistor source. Difficulties arise in those circuits using a field-effect transistor to control power transfers from an alternating polarity power supply because the two connections to the channel region of such a transistor serve alternately as the source rather than one of them serving continually as the source.

Certain field-effect transistor structures are especially useful for providing a field-effect transistor capable of controlling power transfer from an alternating polarity power supply to a load means. Such transistors should have low channel resistance when operated fully on—on the order of tenths of ohms—if they are to be used successfully in a monolithic integrated circuit. Then these transistors, when passing several amps of current, will not cause the circuit to suffer heat dissipation sufficient to disrupt the operation of other circuit components. Further, this channel resistance in a fully turned on device should be more or less symmetrical so there are no current rectification effects occurring. And, of course, the transistor device structure should be capable, when switched off, of withstanding, without breakdown, voltages at least as large as the peak voltage provided by the alternating polarity supply used. In this regard, the applications referenced above entitled "Semiconductor Apparatus" teach various devices, effectively field-effect transistors, which exhibit one or more of these desired characteristics.

The application referenced above entitled "Alternating Polarity Power Supply Control Apparatus" by Pinckaers shows a circuit making use of such a field-effect transistor to control power transfer from an alternating polarity electrical power supply to a load means. A basic circuit from this application is shown in FIG. 1 of the present application. This circuit operates using an enhancement mode, p-channel, MOSFET, 10, for controlling power transfers from an alternating polarity electrical power supply, 11, to a load means, 12. As the above referenced Pinckaers application indicates, several other essentially equivalent circuit versions using other kinds of electronic components for transistor are also possible.

In operation, the two channel connection regions, 15 and 16, of transistor 10 alternately serve as source and drain depending on which one is positive with respect to the other in a cycle of the output voltage of supply 11. With switch, 20, open, the gate region, 14, transistor 10 will approximately be at the positive voltage appearing on either of the sides of supply 11 by virtue of one of the diodes, 17 or 18, thereby being forward biased (the other being reversed biased). This is because gate 14 is electrically isolated from the remaining portions of transistor 10 so that the voltage on gate 14 can never be more than a diode drop plus the negligible drop across the resistor 19, below the positive voltage value appearing on one or the other side of supply 11 at any time.

The voltage drop across either of the diodes 17 or 18 plus the voltage drop across resistor 19 with switch 20 open will always be less than the threshold voltage of transistor 10. Gate 14 will never be more than approximately a diode voltage drop away in voltage from the voltage appearing on whichever of terminating regions 15 and 16 is positive. Hence, with switch 20 open, device theory indicates that transistor 10 will always be switched off and hence there will be no power transfer from supply 11 to load means 12.

However, with switch 20 closed, a voltage will be impressed across resistor 19 by the constant polarity as to cause transistor 10 to switch on and will be added to the voltage drop occurring across whichever one of the diodes 17 and 18 is forward biased through being connected to the positive side of supply 11. Hence, for a sufficient supply 21 voltage, device theory indicates that transistor 10 will be on a times when switch 20 is closed.

A variant of FIG. 1 is shown in FIG. 2 where the diodes 17 and 18 in the circuit of FIG. 1 are provided in the circuit of FIG. 2 by the parasitic effective diodes inherent in the structure of transistor 10 as formed in a substrate having a connection point therein, 13. Several other effective, but parasitic, circuit components inherent in transistor 10 are also shown in FIG. 2 in "lumped" form, all of these being present as a result of the structure of transistor 10. These parasitic components are, in many cases, more likely to be significant for a power controlling transistor such as transistor 10 because it is usually of a relatively large physical size compared to transistors used for controlling signals only. The same component designations are used in the FIG. 2 circuit as are used in the FIG. 1 circuit where the same component is being employed.

Among the parasitic components shown in FIG. 2 are a gate-to-channel capacitance, 22, and a channel-to-substrate capacitance, 23. Two other parasitic capacitances, 8 and 9, are shown which are each effective between gate 14 and one of channel terminating regions 15 or 16. There is also shown the two parasitic channel-to-substrate diodes, 24 and 25, which in the FIG. 2 circuit variant are to take the place of diodes 17 and 18 in the FIG. 1 circuit. Diodes 24 and 25 are provided in the structure of transistor 10 by the semiconductor pn junctions occurring between the regions for source and drain connections in transistor 10 and the substrate of transistor 10. In a p-channel MOSFET, for instance, the substrate material is of n-type conductivity while the connection regions 15 and 16 which terminate the ends of the channel region in the transistor 10, and serve as source and drain regions therein, are formed by diffusion or implantation of p-type conductivity impurities into the substrate material.

Also associated with these pn junctions are parasitic resistances 26 and 27, and parasitic capacitances, 28 and 29. All of these parasitic components will have more or less of an effect in the operating behavior of transistor 10, and so in the behavior of the circuit in which transistor 10 is provided, the significance of the effect depending on the conditions existing in such a circuit. Of course, capacitance 22 is essential for switching on transistor 10 while the other parasitic components shown with transistor 10 are normally desired to contribute as insignificantly as possible to the circuit operation. In FIG. 2, of course, parasitic diodes 24 and 25 are also necessary for circuit operation since they are replacing diode 17 and 18 of FIG. 1.

To have diodes 25 and 26 substitute for diodes 17 and 18 in FIG. 1 effectively, a direct electrical connection is made between substrate 13 and resistor 19 as shown in FIG. 2. Assuming that frequencies of operation are not high enough so that the parasitic capacitance shown in FIG. 2 (which would also be present in connection with transistor 10 of FIG. 1) act to change the operating characteristics from those occurring in connection with the circuit operation of FIG. 1, the operation of the FIG. 2 circuit will proceed in the manner described for the operation of the FIG. 1 circuit. Further, other circuits more or less equivalent to that shown in FIG. 1 of the present application, as described in the Pinckaers application, can also be shown to have circuit equivalents of the nature shown in FIG. 2 here and these would operate similarly.

Even though the circuits of FIGS. 1 and 2 can control alternating polarity electrical power supply power transfer, a desirable feature for circuits for this purpose would be eliminating the need for a second power supply such as the constant polarity supplies used in the FIG. 1 and 2 circuits. In some circumstances, the use of another control circuit scheme which would avoid depending on the parasitic diodes inherent in the primary power transfer controlling transistor, but not requiring two separate diodes, would also be desirable. And in high voltage circuits, the voltage breakdown of a single field-effect transistor device used to control power transfers from the alternating polarity power supply may not be sufficient.

SUMMARY OF THE INVENTION

The invention provides a circuit with a field-effect transistor device, or devices, to be used in controlling power transfers between an alternating polarity power supply and a load, where this supply and load, in operation, would be connected on either side of the device channel or on either side of device channels connected in series. In one form, there effectively are unidirectional current conducting means electrically connected from either side of the field-effect transistor device channel to the gate region of that device, selectively through either an energy storage means or directly, the selection being made by selectively operated switching means. The energy storage means can be such as to obtain its energy from the alternating polarity power supply through use of at least one other unidirectional current conducting means.

In another form, the field-effect device, with either side of its channel connected in this manner to the alternating polarity supply and load, has its gate operated by a second field-effect transistor device. This second device is connected to a bias control means to thereby selectively control the power transfers from the alternating supply to the load. This second field-effect device has its gate controlled by the alternating polarity power supply during operation.

Finally, a circuit with a plurality of field-effect devices are connected in series across the alternating polarity power supply and the load means leads to the voltage drop across these field-effect transistor devices, when off, being spread over the plurality to thereby avoid breakdown of any one device. The gates are operated through isolation means from a common point connected to a bias control means for selectively controlling power transfers from the alternating polarity power supply to the load means.

DESCRIPTION OF THE PREFERRED EMBODIMENTS

Figure 1:
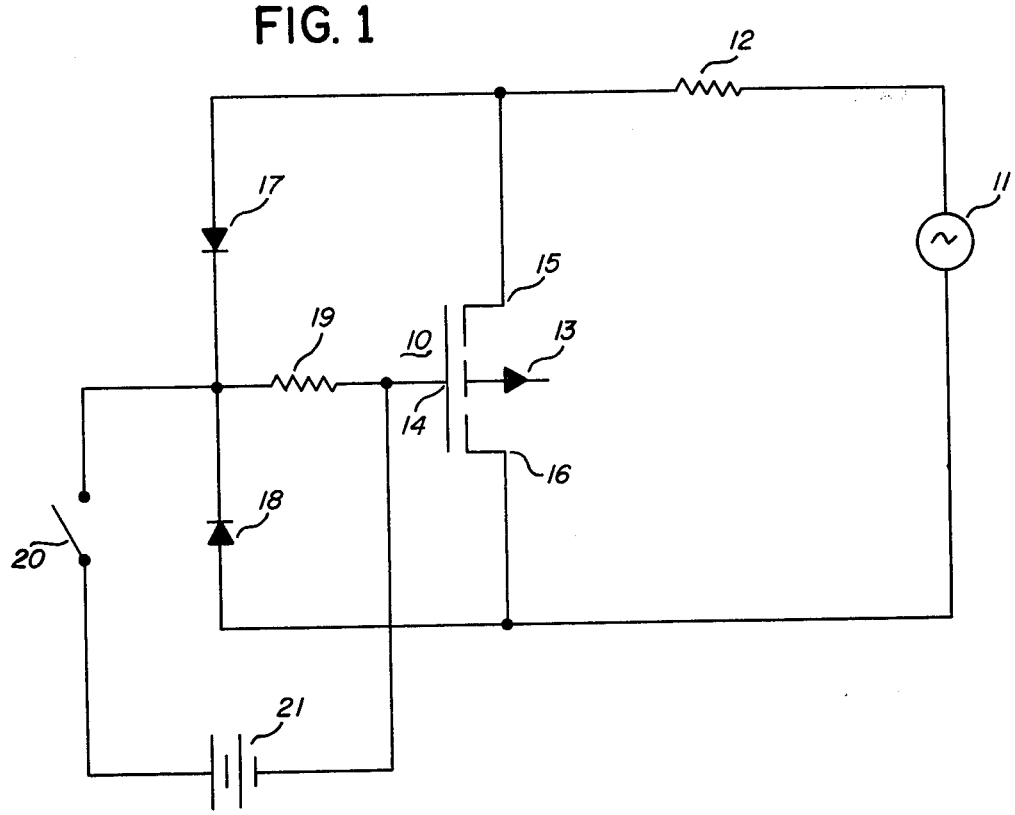
FIG. 1 shows a kind of circuit for controlling power transfers from an alternating polarity electrical power supply to a load means.
Figure 2:
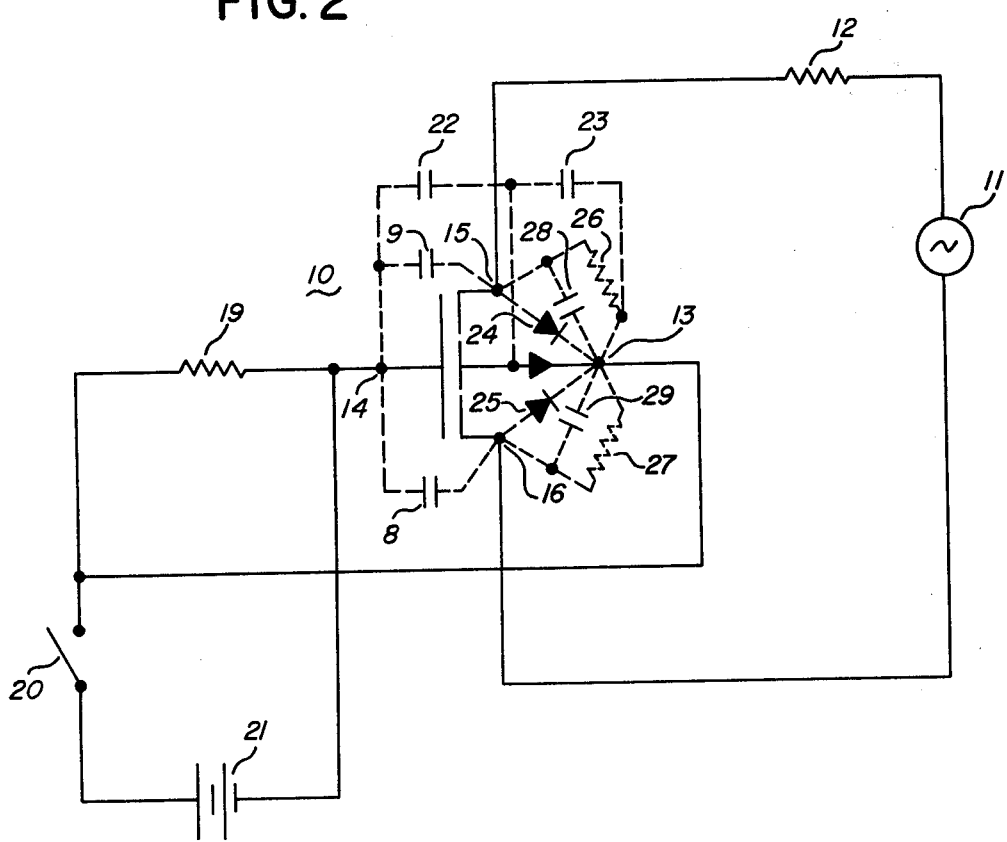
FIG. 2 shows a circuit variant of the FIG. 1 circuit used for the same purpose.
Figure 3:
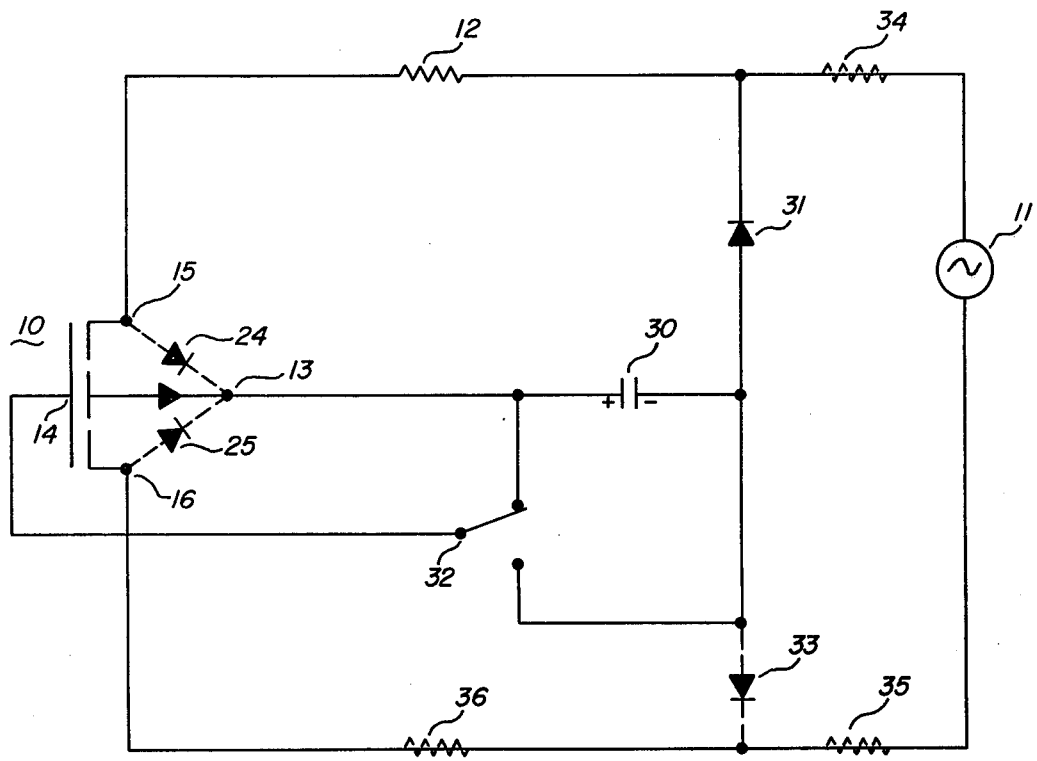
FIG. 3 shows a first embodiment of the circuit of the invention to be used for the same purpose.

FIG. 3 shows a circuit of the present invention in which a capacitor, 30, is used as the energy storage means. This energy storage means is for energizing the input signal controlled circuitry used to direct the operation of the primary circuit component present for the purpose of controlling power transfers from an alternating polarity electrical power supply means, 11, to a load means 12. This primary component is shown in the circuit of FIG. 3 as effectively, an enhancement mode, p-channel, MOSFET, 10, with which only a selected few of the parasitic components inherent therein are shown in FIG. 3 from among those actually present as shown for the similar transistor 10 of FIG. 2.

The parasitic components shown in FIG. 3 are just the parasitic diodes 24 and 25 of FIG. 2 where the same designation has been maintained for those diodes in FIG. 3. Also retained is the designation 14 for the gate connection of transistor 10, and the designations 15 and 16 for the terminating regions of transistor which are connected to the channel region of this field-effect transistor. The substrate connection is again designated 13.

At sufficiently low frequencies, the parasitic capacitances shown in connection with transistor 10 in FIG. 2 will not be significant factors in the operation of the circuit of FIG. 3. Also, the leakage resistances 26 and 27 of FIG. 2 are usually sufficiently large so that they also will not be significant in the operation of this circuit. Further, note that load means 12 could also have a reactive component but has been shown and will be described as being resistive for ease of understanding and exposition.

The sole source of power used to operate the circuit of FIG. 3 is supply 11. Supply 11 not only provides power for controlled transfer to load means 12, upon being selected to do so by appropriately activating a switch means, 32, but also provides power to be stored in capacitor 30 to operate the other circuit components present used to control transistor 10. Of course, a separate power supply means could be used in place of capacitance 30 and a circuit for which this must be done using depletion mode devices is described below.

Supply means 11 and load means 12 are connected in series and this circuit portion is connected at each end to one of the terminating regions 15 and and 16 of transistor 10. The gate of transistor 10 is connected to switch means 32 which can be connected to either side of capacitor 30. Capacitor 30 has one side thereof connected to substrate connection 13 while the other side is connected to the anode of a diode, 31. The cathode of this diode is connected to both supply 11 and load means 12.

In operation with switch 32 connecting gate 14 to the substrate side of capacitor 30, supply means 11 will charge capacitor 30. This occurs when the side of supply 11 not connected to load means 12 is positive while the side connected to load means 12 is relatively negative. In these circumstances, a charging current will flow through channel terminating region 16, parasitic diode 25, capacitor 30, and diode 31 to thereby charge capacitor 30. When supply 11 changes polarity, there will be no current flow through capacitor 30 due to supply 11 because diode 31 will be reversed bias. Further, there will be little discharge of capacitor 30 because of the reverse bias nature of all the diodes, including the parasitic ones, between the positive side of capacitor 30 and the negative side thereof as shown in FIG. 3. The only discharge of capacitor 30 under these circumstances will be due to small leakages through the large value leakage resistances present but not shown.

In this situation, transistor 10 will be held fully off because of the short occurring between gate 14 and substrate 13 through switch 32. Gate 14 will follow the substrate which will always be within a voltage drop across one of the parasitic diodes 24 or 25 of the positive side of supply 11. Thus, the threshold voltage of transistor 10 will never be exceeded by the voltage occurring between gate region 14 and whichever of the terminating regions 15 and 16 is positive with respect to the other. Device theory indicates in these circumstances, then, that transistor 10 will indeed be off.

When switch 32 is changed to connect the negatively charged side of capacitor 32 to gate region 14, transistor 10 is switched on. This occurs because gate region 14 is held negative with respect to the substrate by the voltage appearing across capacitor 30. Yet, the substrate is still always within a diode voltage drop of the positive voltage value appearing on one side of supply 11 or the other through parasitic diode 24 and 25. As a result, the gate of transistor 10 is held negative with respect to whichever of channel terminating regions 15 and 16 is positive which device theory indicates is then acting as the transistor source. For sufficient voltage across capacitor 30 (which in turn depends on a sufficient peak output voltage being provided by supply 11), device theory indicates that, in these circumstances, transistor 10 will be fully on.

Note that the occurrence of any discharging of capacitor 30 through the leakage resistances (not shown in FIG. 3) spanning parasitic diodes 24 and 25 will not make any difference in the circuit operation. This is because supply 11 will recharge capacitor 30 on each half cycle during which the side of supply 11 not connected to the load means 12 is positive. Again, the charging path will be through the parasitic diode 25 and diode 31.

Thus, the circuit of FIG. 3 provides a manner to control power transfers from alternating supply 11 to load means 12 by simply having switch means 32 selectively connect gate region 14 to one side or the other of capacitor 30. No external electrical power supply is required for operating the gate of the primary power transfer controlling component, transistor 10. The power for controlling this gate is supplied by supply 11 in storage across capacitor 30.

Certain modifications of this circuit are also possible and these are indicated by the dashed line components shown in FIG. 3. First of all, the addition of a diode 33 leads to capacitor 30 being charged in every half cycle of supply 11 assuming the presence of diode 31 is continued. However, diode 31 could be eliminated and the circuit would continue to operate but not quite so satisfactorily as when diode 31 is present alone (or even with both diodes 31 and 33 present).

The difficulty in the circuit version where diode 33 is used along arises because such use leads to transistor 10 not being always fully on when switch 32 is connected to the negative side of capacitor 30 for the purpose of bringing this about. This is because the recharging of capacitor 30 for any charge losses occurring, due to leakages, cannot take place unless transistor 10 is sufficiently turned off for the voltage drop thereacross to rise to a level of a few volts. Until that occurs in an arrangement using diode 33 alone, transistor 10 will have so little voltage drop across it (that is, will appear effectively as a short circuit) that no charging current will be able to flow through parasitic diode 24 to charge capacitor 30.

This same kind of problem arises when load means 12 is replaced by a short and another load means, 34, is substituted in the circuit of FIG. 3. Note, however, that these circuits are operable but that the current provided by supply 11 through load means 34 will decrease somewhat from what it would have been had transistor 10 stayed fully turned on and the power dissipation in transistor 10 will increase. Use of load means 34 in place of load means 12 will also require an initial current, during the first half cycle after switch 32 is activated to switch transistor 10 on, to be drawn through load means 34 to charge capacitor 30.

The other dashed line load means, 35 and 36, are also possible alternative load means locations in the circuit of FIG. 3 with load means 12 shorted. Similar results will occur by using these load means as have occurred in describing the use of corresponding load means 12 and 34. Any of these load means can have reactive portions thereof, but such complications have not been discussed in describing the operation of the circuit of FIG. 3 to avoid the need for describing magnitude and phase angle relationships.

Figure 4:
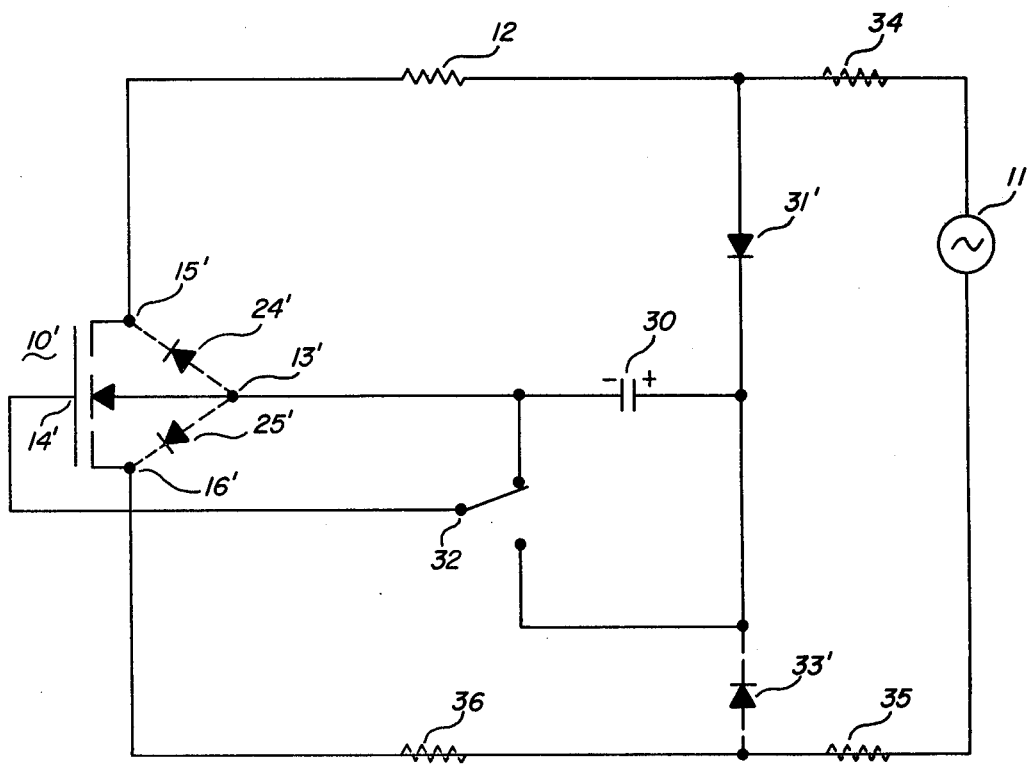
FIG. 4 shows a second embodiment of the circuit of the invention.

FIG. 4 shows another version of the circuit of FIG. 3, but this time using what is effectively an enhancement mode, n-channel, MOSFET device, 10', in place of the p-channel field-effect transistor device 10 of the circuit in FIG. 3. In this arrangement, the diodes 31 and 33 of FIG. 3 have been reversed in direction as shown in FIG. 4 and so have been designated diodes 31' and 33'. The operation of the circuit of FIG. 4 occurs in the same manner as the operation of the circuit of FIG. 3, but the energy storage direction of capacitor 30 has been reversed to accommodate the use of the n-channel transistor device 10'. Device theory for this device indicates gate region 14' must be positive relative to whichever of the channel terminating regions 15' and 16' is relatively negative to the other if transistor 10' is to be on.

Figure 5:
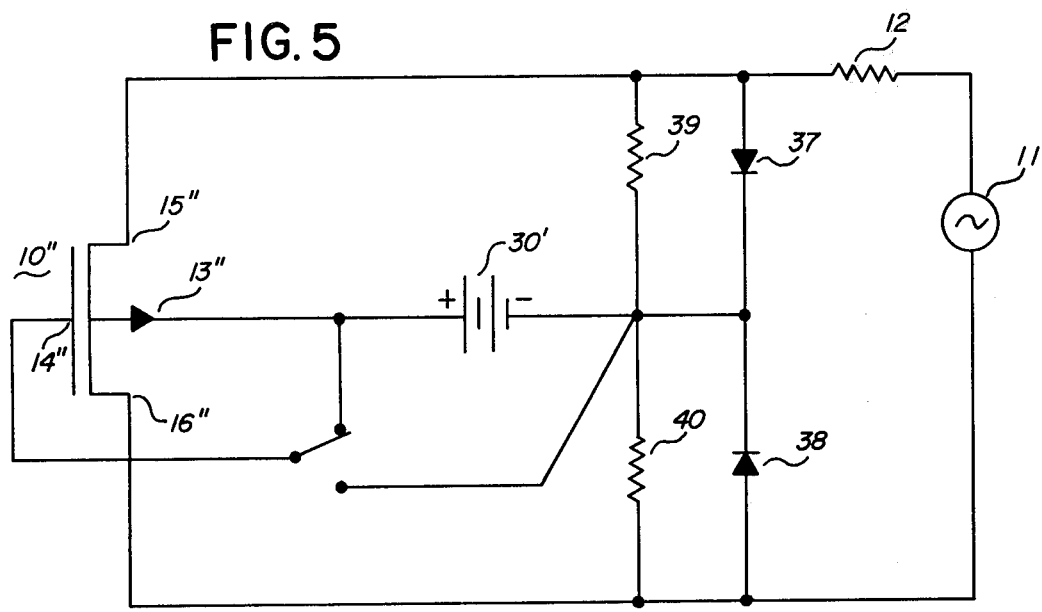
FIG. 5 shows a third embodiment of the circuit of the invention.

A somewhat analogous circuit to the circuits shown in FIGS. 3 and 4 but for depletion mode devices is shown in FIG. 5. While a depletion mode, p-channel, MOSFET device, 10", is shown in FIG. 5, other depletion mode devices such as a junction field-effect transfer device (JFET) and a metal-semiconductor field-effect transistor device (MESFET) could also be used in the circuit of FIG. 5.

The external power supply means, 30', in FIG. 5 serves as the energy storage means for the circuit in place of the capacitor 30 shown in FIGS. 3 and 4. Energy storage means 30' is used to bias transistor 10" off through having substrate 13" held positive with respect to whichever of terminating regions 15" and 16" is serving as the source for transistor 10" in being positive with respect to the other. This occurs by virtue of having energy storage means 30' following the positive side of supply 11 through diodes, designated 37 and 38, and accompanying resistors, designated 39 and 40. These resistors are provided so that substrate 13" maintains the just described relationship with terminating regions 15" and 16" at the crossover conduction point between diodes 37 and 38. Actually, for a sufficiently large voltage value for supply 30', diodes 37 and 38 could be eliminated while retaining only resistors 39 and 40. The circuit of FIG. 5 makes no use of the parasitic diodes inherent in transistor 10".

Figure 6:
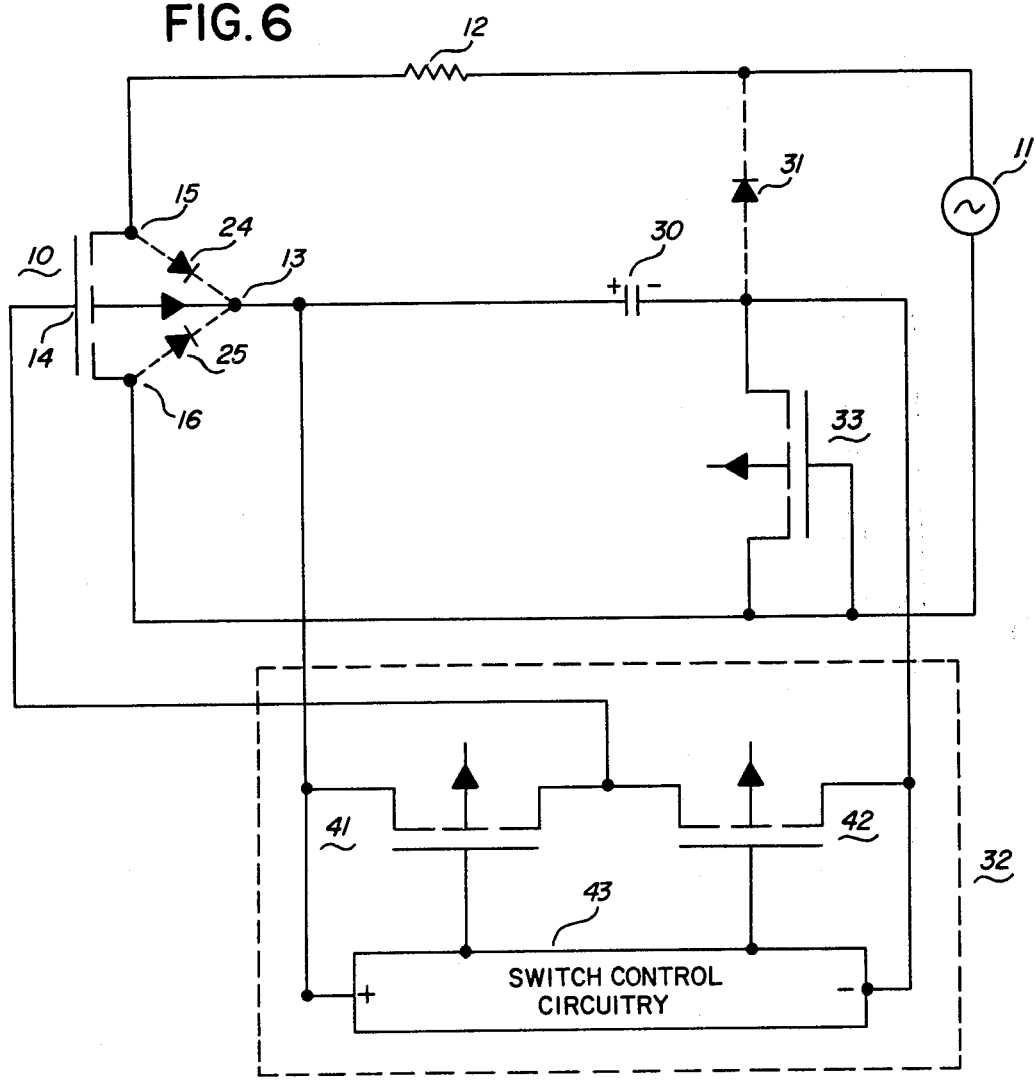
FIG. 6 shows a fourth embodiment of the circuit of the invention.

Turning to FIG. 6 now, a circuit is shown there which is equivalent to the circuit in FIG. 3 but which has an electronic implementation for the switch 32 of FIG. 3. Designations for components in FIG. 3 common to FIG. 6 have been retained in the latter figure. Also, portions of the circuit shown in FIG. 6 are shown in a circuit form suitable for integration in a monolithic integrated circuit chip, including switch means 32.

In FIG. 6, diode 33 is shown as a p-channel MOSFET having its gate region shorted to one of the channel terminating regions thereof to thereby exhibit the characteristics of a diode. This p-channel MOSFET can be formed in the monolithic integrated substrate along with transistor 10 and along with p-channel MOSFET'S used in control switch means 32 designated 41 and 42.

Diode 31, however, cannot be formed as a p-channel MOSFET integrated in the same monolithic integrated circuit chip where its substrate would be electrically in common with substrates of other transistors shown in FIG. 6, and so has continued to be indicated by the normal diode symbol in this figure usually indicating an ordinary pn semiconductor junction diode. Nevertheless, no embodiment of diode 31 can be used with the circuit of FIG. 6 where the diode is formed in a substrate that is not electrically isolated from the substrate for the chip containing the remainder of the circuit components. This is due to detrimental interaction occurring between the diode and other circuit components if provided on common or on electrically joined substrates. Thus, diode 31 cannot be formed in the chip containing the remainder of the circuit components including transistor 10, when formed by typical fabrication methods. Hence, diode 31, if used at all, will typically be provided as an external component to any monolithic integrated circuit version of the FIG. 6 circuit and has therefore been shown in dashed lines.

On the other hand, diode 31 may, as before, be used exclusively without making any use of diode 33 where no current is desired to be passed through the load means 12 and no partial turn off of transistor 10 is desired during times when transistor 10 is otherwise to be on. Of course, diode 33 may be used exclusively without diode 31 where these factors are not important as described above.

The substrate of diode 31 can be in common with the substrates of other transistors in FIG. 6, even if diode 31 is formed by a field-effect transistor if load 12 is shorted and load means 12 placed instead between diode 31 and supply 11. This is the arrangement in FIG. 3 if load means 34 in that figure is used.

In the arrangement of FIG. 6, field-effect transistors 41 and 42 and the associated switch control circuitry, 43, are all electrically energized through the stored electrical energy provided in capacitor 30 by supply 11. Thus, no further power supplies are required to operate the circuit shown in FIG. 6 although, of course, storage means 30 could be a battery equivalent rather than a capacitance. Switch control circuitry 43 is expected to be formed in the monolithic integrated circuit with transistors 10, 41 and 42 and is therefore typically going to be constructed with p-channel MOS circuitry components. Switch circuitry 43 will contain such electronic or electromechanical components, or sensors, or some combination thereof, as desired to produce the signals to operate field-effect transistors 41 and 42 as a switching means output to control the operation of the circuit of FIG. 6.

In operation, switch means 32 has either transistor 41 on and transistor 42 off, or vice versa, as determined by control circuitry 43 and so these transistors together operate in series as the single pole, double throw switch 32 shown in FIG. 3. If transistor 41 is turned on and transistor 42 is turned off, gate 14 of transistor 10 is effectively directly electrically connected to the substrate electrode connection 13 of transistor 10. In these circumstances, gate 14 is always close to the voltage occurring on the positive side of supply 11 at any given time as described above in connection with FIG. 3.

Hence, transistor 10 is off. Capacitor 30 is charged in just the manner described above. In the opposite condition, when transistor 41 is off and transistor 42 is on, transistor 10 is on. This is so because capacitor 30 is then connected between substrate connection 13 and gate 14 of transistor 10 through the effective short provided by transistor 42 being on. As described above in connection with FIG. 3, this results in gate 14 being held negative with respect to whichever of terminating regions 15 and 16 is positive and acting as a source. Hence, transistor 10 will be on. Again, the charging of capacitor 30 in this condition will be just as described in connection with the circuit shown in FIG. 3.

As noted above, the operation of circuits shown in FIGS. 3, 4, 5, and 6 as described above depends on use of a sufficiently low frequency of polarity alternation in the output voltage of alternating polarity voltage power supply 11. Otherwise, the parasitic capacitive and resistive effects associated with the primary power transfer control transistor in these circuits, as specifically shown in connection with transistor 10 in FIG. 2, may lead to different operating results.

Figure 7:
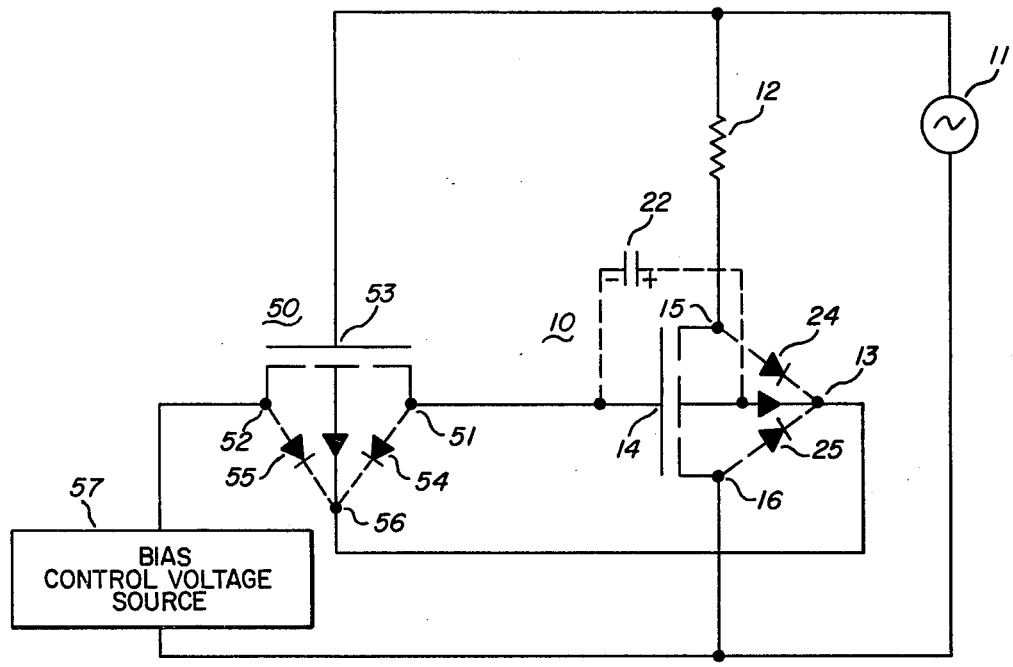
FIG. 7 shows a fifth embodiment of the circuit of the invention.

FIG. 7 shows an alternative method for providing the control circuitry for directing operation of the primary power transfer control component and provided in a manner where the entire control circuit can be formed in a single monolithic integrated circuit chip. Again, the primary power transfer control component is p-channel field-effect transistor 10 from FIG. 2 (which can be a device from the references cited above entitled "Semiconductor Apparatus"), but with only parasitic diodes 24 and 25 being shown along with parasitic gate-to-channel capacitance 22. This capacitance is the key to the operation of the circuit as it provides the bias voltage necessary to operate transistor 10 in those half cycles of power supply 11 in which a signal controlled transistor, 50, for controlling transistor 10 is turned off.

Signal controlled transistor 50 is controlled by the bias control voltage source, 57. Transistor 50 is also an enhancement mode, p-channel, MOSFET device although not necessarily similar to transistor 10 since transistor 50 need not carry the substantial currents which transistor 10 may in controlling power transfers from supply 11 to load means 12. Transistor 50 is shown to have channel terminating regions, 51 and 52, and a gate region, 53. Also shown between the channel connecting regions 51 and 52 and the substrate connection, 56, are two parasitic diodes, 54 and 55, inherent in the structure of transistor 50.

Channel connecting regions 15 and 16 of transistor 10 are electrically connected to either end of the series combination of load means 12 and alternating polarity electrical supply means 11. Gate region 53 of transistor 50 is connected to both supply 11 and load means 12. Bias control voltage source 57 is connected between channel terminating region 52 of transistor 50 and supply means 11. Channel terminating region 51 of transistor 50 is connectedd to gate region 14 of transistor 10. Substrate connections 13 of transistor 10 and 56 of transistor 50 are joined in common as would effectively be the case in a monolithic integrated circuit version of the FIG. 7 circuit. Bias control voltage source 57 is capable of switching terminating region 52 of transistor 50 between zero volts and a negative voltage with respect to side of source 57 connected to supply 11. This negative voltage must sufficiently exceed the threshold voltage of transistor 10 to be capable of switching transistor 10 on strongly.

In operation, first consider the situation when bias source 57 is at zero volts and the supply 11 output voltage is negative on the load side of supply 11. In these circumstances, channel terminating region 16 of transistor 10 is positive with respect to channel terminating region 15 and, therefore, device theory indicates that channel terminating region 16 is acting as a source for transistor 10. Furthermore, since channel terminating region 52 of transistor 50 is positive through bias source 57 with respect to channel terminating region 51, region 52 indicated to serve as the source of transistor 50. Therefore, because gate region 53 of transistor 50 is held negative by supply 11, transistor 50 is turned on and becomes an effective short between regions 51 and 52. The result is that gate region 14 of transistor 10 is at approximately the same voltage as channel terminating region 16 of transistor 10 acting as the transistor source.

In this situation, device theory indicates that transistor 10 is off. At the same time, little or no charge develops on parasitic capacitance 22 in view of gate region 14 being approximately at the same voltage as channel terminating region 16 along with parasitic diode 25 holding substrate 13 also very close in voltage to channel terminating region 16.

However, the situation changes when the bias source 57 places channel terminating region 52 at a negative voltage with the load side of supply 11 continued to be considered at a negative voltage. Channel connecting region 16 remains the source for channel 10 in these circumstances, but device theory indicates that channel connecting region 51 of transistor 50 now becomes a source for this transistor because of the negative voltage now present on channel connecting region 52 thereof. That is, bias source 57 acts through channel terminating region 16, parasitic diode 25, and parasitic capacitance 22, all associated with transistor 10, to provide a positive voltage on channel terminating region 51 of transistor 50 with respect to channel terminating region 52 thereof.

As a result, parasitic capacitance 22 begins to charge toward a voltage level equal to the negative voltage provided by bias source 57. Because of the negative voltage supplied by source 57, the charge accumulating on capacitance 22 will be such to hold gate region 14 of transistor 10 negative with respect to substrate connection 13 of transistor 10. Assuming the voltage supplied by bias source 57 is sufficiently in excess of the threshold voltage of transistor 10, selecting a negative voltage from source 57 to be impressed on channel terminating region 52 of transistor 50 will result in switching on transistor 10 by virtue of the resulting charge accumulation on capacitance 22.

In summary, when the load side of supply 11 is at a negative voltage, with respect to the other side thereof, transistor 50 will always be on. However, selective energization of bias source 57 will select which of channel terminating regions 51 or 52 of transistor 50 will be acting as the source for this transistor. When channel terminating regiion 52 of transistor 50 is acting as the source thereof, transistor 10 will be off. Alternatively, when channel terminating region 51 is acting as the source, transistor 10 will be on assuming a sufficient magnitude for the negative voltage being supplied by source 57.

Consider now the opposite situation when the load side of supply 11 becomes positive. Under these circumstances, device theory indicates that channel terminating region 15 will serve as the source for transistor 10.

Further, as gate region 53 of transistor 50 is connected to the most positive voltage in the circuit of FIG. 7, device theory also indicates transistor 50 will be off whenever the load side of supply 11 is positive. This is true for any value of the voltage being supplied by source 57.

Now with transistor 50 off, gate region 14 of transistor 10 is more or less open circuited so that any charge accumulated in capacitance 22 remains there except for that which is lost due to parasitic leakage paths associated with transistor 50 which are always present but can be of a very small conductivity. If this conductivity is sufficiently small, there will be no significant discharge from capacitance 22 during half cycles of supply 11 when the load side thereof is positive.

Hence, if bias source 57 had placed a negative voltage on channel terminatings region 52 in a preceding half cycle when the load side of supply 11 was negative—resulting in switching on transistor 10 in that half cycle and concurrently charging capacitance 22—transistor 10 will remain on in the succeeding half cycle when the load side of supply 11 is positive. On the other hand, in a preceding half cycle when the load side of supply 11 was negative, bias source 57 may have left channel terminating region 52 at the voltage value appearing on channel terminating region 16 of transistor 10. Then transistor 10 was off and capacitance 22 was not charged in that preceding half cycle and transistor 10 will remain off in the succeeding half cycle when the load side of supply 11 becomes positive.

Figure 8:
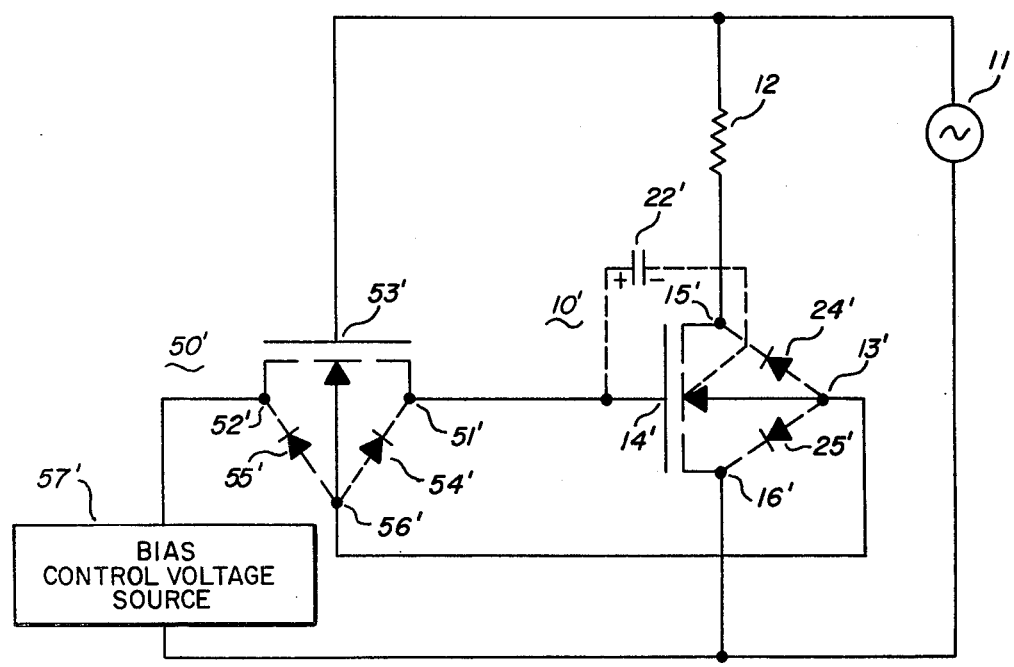
FIG. 8 shows a sixth embodiment of the circuit of the invention.

Thus, the circuit of FIG. 7 can control power transfers from supply means 11 to load means 12 by selectively operating by source 57 between zero volts and a sufficiently negative voltage. FIG. 8 shows an analogous circuit for the situation of transistor 10 of FIG. 7 being replaced by, effectively, an enhancement mode, n-channel, MOSFET which is designated in 10' in FIG. 8. Transistor 50 of FIG. 7 becomes transistor 50' in FIG. 8. The only other change is that bias source 57 of FIG. 7 becomes bias source 57' in FIG. 8 and operates between zero volts and a positive voltage. The circuit of FIG. 8 then operates in the same manner as the circuit of FIG. 7 but with opposite polarities for the voltages therein.

A variation in the circuit appearing in both FIGS. 7 and 8 is to change the connections of bias control voltage source 57 from being connected to terminating regions of the primary power transfer control transistors and jointly to supply 11. Thus in FIG. 7, bias control source 57 need not be connected to terminating region 16 and to supply 11 but rather can be connected to substrate connections 56 and 13. Similarly, in FIG. 8, bias control voltage source 57' need not be connected to terminating region 16' and supply 11. Again, the alternative is to connect source 57' to substrate connections 56' and 13'. In these alternatives concerning connecting the bias control voltage sources 57 and 57', the essential nature of the circuit operation does not change from that described above for the circuits shown in FIGS. 7 and 8.

Figure 9:
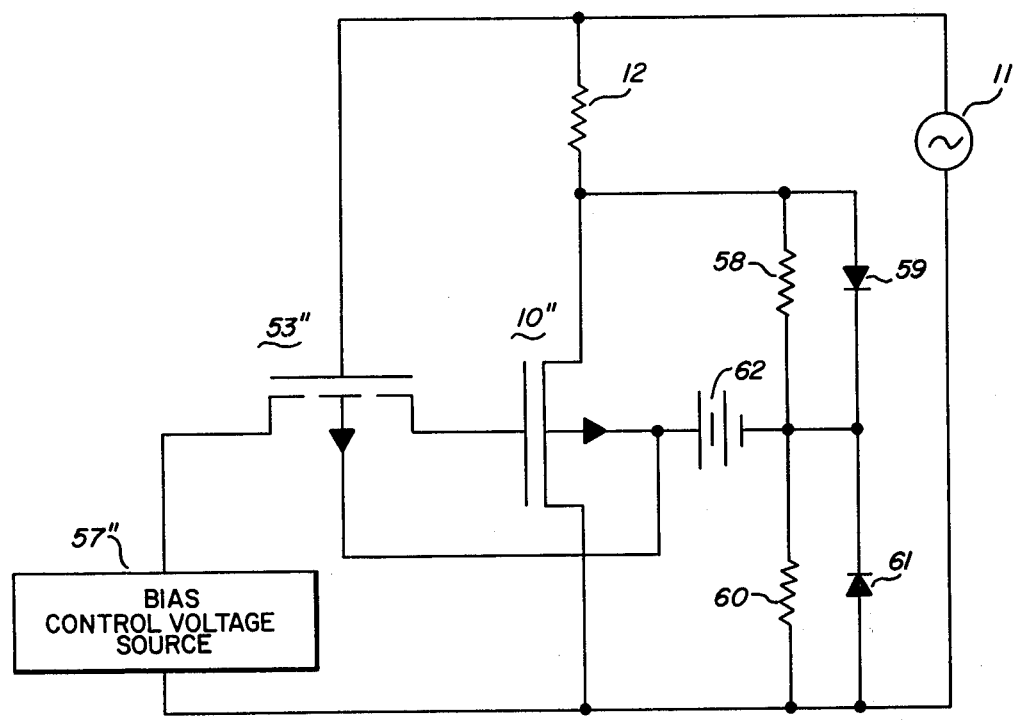
FIG. 9 shows a seventh embodiment of the circuit of the invention.

Another version of the circuits of FIG. 7 and FIG. 8 makes possible the use of depletion mode devices as the primary power transfer controlling components in place of the enhancement mode field-effect transistors shown in those figures. A circuit version corresponding to FIG. 7 is shown in FIG. 9 where two circuits each pairing a resistor and a diode in parallel are provided in series with one another. Further, there is added an external constant polarity power supply provided between the junction of these pairs in series and the substrate of the primary power transfer controlling component. This primary power transfer controlling component is shown as, effectively, a depletion mode, p-channel, MOSFET, 10", in FIG. 9. However, other common depletion mode components such as a JFET or a MESFET could also be used.

The two resistor-diode pair circuits in series includes a first pair having a resistor, 58, and a diode, 59, and a second pair having a resistor, 60, and a diode, 61, which together establish the reference voltage point for a constant polarity voltage supply, 62. This voltage supply is used to bias depletion mode transistor 10" off so that the remainder of the circuit operates approximately as the circuit of FIG. 7. The additional elements in the resistor-diode pairs could be integrated in a monolithic integrated circuit chip. Of course, constant polarity supply 62 represents the equivalent of a battery, or an actual battery which would be external to any monolithic integrated circuit chip.

The circuits of FIGS. 7, 8 and 9 must also be operated at sufficiently low frequencies of polarity alternation in the output voltage of alternating polarity voltage supply 11. If not, parasitics associated with the transistors of these circuits may lead to operational behavior differing from those described above.

There can be situations encountered when the peak value of the voltage provided by an alternating polarity electrical power supply is greater than the breakdown voltage which can be achieved in the design of a single field-effect transistor device used as the primary power transfer control component. This is true even for devices of the kind described in the references cited above entitled "Semiconductor Apparatus". However, a plurality of these field-effect transistor devices provided in series with one another can be used to increase the breakdown voltage capability of the component entity used to primarily control power transfers from such an alternating polarity supply. In series, such devices will still be able to pass substantial currents.

Figure 10:
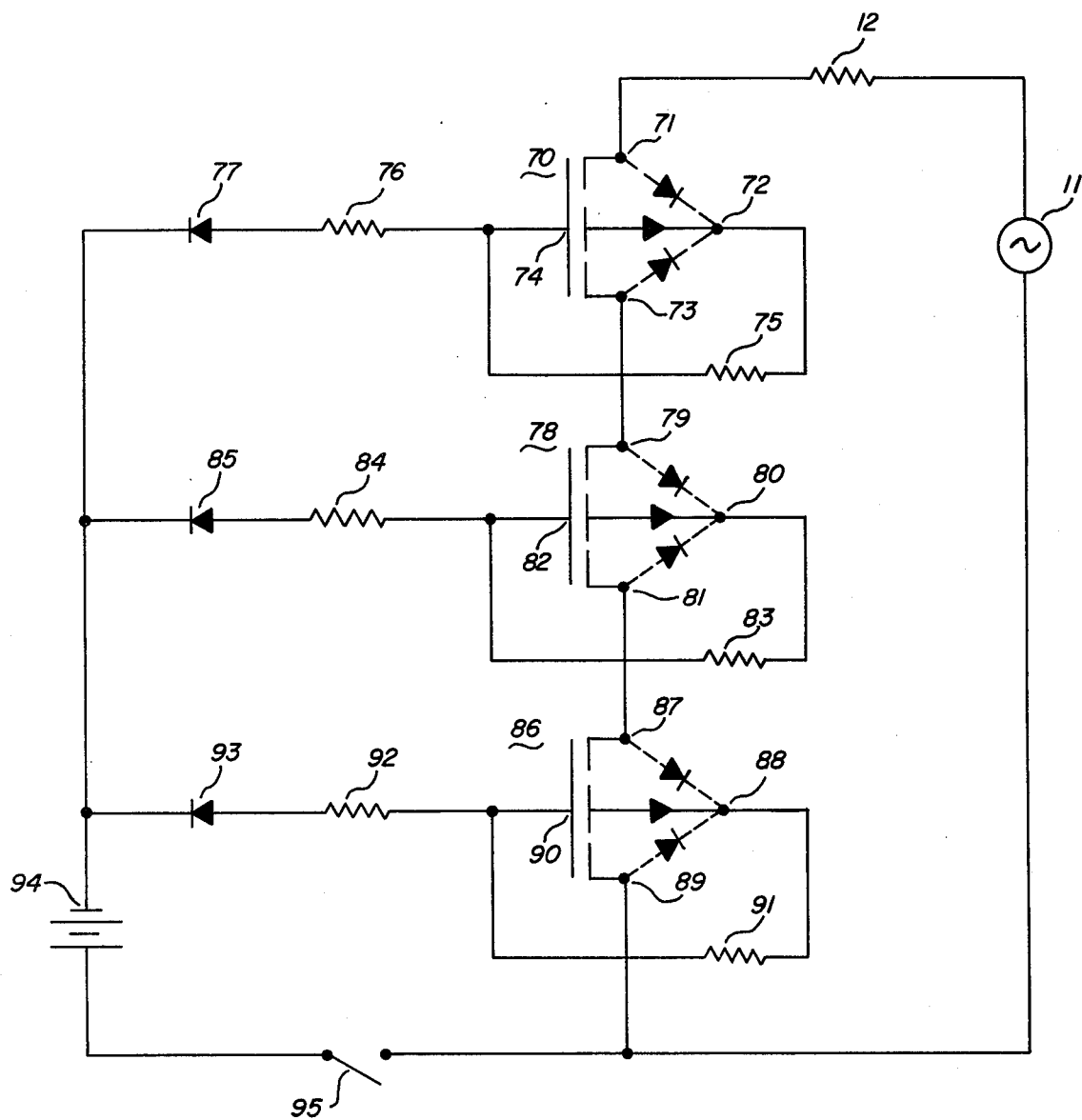
FIG. 10 shows an eighth embodiment of the circuit of the invention.

A circuit for applying field-effect transistor devices in series as the primary power transfer component entity is shown in FIG. 10. However, such a circuit cannot be provided in a single monolithic integrated circuit chip because of the need for the substrates of the field-effect transistor devices shown in FIG. 10 to be operated at differing voltage levels.

FIG. 10 shows three enhancement mode, p-channel, MOSFET's, 70, 78, and 86, arranged in series. Three devices are shown but just two devices could be used or some greater number—the criteria for choosing this number being that the the effective breakdown voltages of the devices, between the terminating regions therein serving as drains and sources and the gate regions, should not in total be exceeded by the peak voltage of alternating polarity electrical power supply 11. These transistor devices are like device 10 of FIG. 2 but only the parasitic diodes associated with each transistor is shown in FIG. 10 and they have not been given individual designations there. Supply 11 and load means 12 are of the same nature as shown in previous figures and so have seen designated consistently therewith.

Transistor 70 has terminating regions designated 71 and 73, a gate region designated 74, and a substrate connection designated 72. Similarly, transistor 78 has terminating regions designated 79, 81, a gate region designated 82, and a substrate connection designated 80.

Again, transistor 86 has terminating regions designated 87 and 89, a gate region designated 90, and a substrate connection designated 88. Terminating region 73 of transistor 70 is connected to terminating region 79 of transistor 80 and terminating region 81 of transistor 80 is connected to terminating region 87 of transistor 86. Terminating region 71 of transistor 70 is connected to the circuit arrangement portion having supply 11 and load means 12 in series as is terminating region 89 of transistor 86.

Each of the field-effect transistors 70, 78 and 86 has its substrate coupled to its gate region by a conductive means. Thus, transistor 70 has a resistor, 75, connected between gate region 74 and substrate 72. Transistor 78 has a resistor, 83, connected between gate region 82 and substrate 80. An finally, transistor 86, in the same manner, has a resistor, 91, connected between gate region 90 and substrate 88.

Also connected to the gate regions are isolating arrangements which are also joined together at a common node. In this regard, FIG. 10 shows the cathodes of three diodes, 77, 85 and 93, are in joint electrical contact. A resistor, 76, is connected between gate region 74 of transistor 70 and the anode of diode 77. Again, a resistor, 84, is connected between gate region 82 of transistor 78 and the anode of diode 85. And similarly, a resistor, 92, is connected between the gate region 90 of transistor 86 and the anode of diode 93.

A bias circuit arrangement is shown including an energy storage means, 94, shown as a battery and a switching means, 95. These are connected in series and the series combination is connected between the common node of the cathodes of diodes 77, 85 and 93 and terminating region 89 of transistor 86. Storage means 94 must provide a voltage exceeding the threshold value for the transistors.

In operation, taking switch 95 as being open, when supply 11 has a positive voltage on the load side thereof, device theory indicates that terminating region 71 of transistor 70 serves as the source of this transistor. Similarly, terminating region 79 of transistor 78 and terminating region 87 of transistor 86 also serves as sources. The parasitic diodes associated with transistors 70, 78 and 86, and leading from these sources, will hold the substrates of the transistors within a diode drop of the voltage value appearing on the sources of these transistors. The actual voltage occurring in each substrate connection of transistors 70, 78 and 86 will depend on the peak voltage value provided by supply 11 and upon the nonlinear breakdown characteristics of these transistors. For well matched transistors, the voltage drop across each of them at any time, which also determines the voltage levels appearing at the substrate connections, will be approximately an equal portion of the total voltage being supplied by supply 11 at that time.

The resistors 75, 83 and 91 each couple the substrate connection of each of transistors 70, 78 and 86 to the gate regions of these transistors, respectively. Hence, each of transistors 70, 78 and 86 will be off because the gate regions 74, 82 and 90, respectively, will be no more than a diode voltage drop below the respective terminating regions 71, 79 and 87 acting as sources for these transistors due to this coupling.

The anode of diode 77 will also be approximately at the voltage of substrate connection 72 because of coupling resistor 75 and isolating resistor 76. This will result in diode 77 being forward biased while diodes 85 and 93 are reversed biased since the anodes of these latter two diodes are approximately at the voltage levels of the substrate connections 80 and 89, respectively. Of course, the breakdown voltage value of the diodes 85 and 93 plus the breakdown values from gate-to-substrate of transistors 78 and 86, respectively, must be sufficient to withstand approximately the peak voltage provided by supply 11.

Because of the symmetry of the circuit when switch 95 is open, the operation of the circuit will be just the same when the load side of supply 11 goes negative with respect to the other side of supply 11. Of course, in this situation terminating region 89 of transistor 86, terminating region 81 of transistor 78 and terminating region 73 of transistor 70 serve as the sources for the corresponding transistors as indicated by device theory.

Now consider the operation of the FIG. 10 circuit with switch 95 closed. If switch 95 is closed when the load side of supply 11 is in the positive half cycle, the cathodes of diodes 77, 85 and 93 are all brought to a negative voltage with respect to the relatively negative side of supply, i.e., the side opposite the load side of supply 11. The substrate connections 72, 80 and 88, on the other hand, are all positive because of the substrate diodes and leakages with the load side of supply 11 at a positive voltage. Thus, gate regions 74, 82 and 90 of transistors 70, 78 and 86, respectively, all go negative with respect to the terminating regions 71, 79 and 87, respectively, of these transistors due to the voltage divider action between the coupling resistors and the isolating resistors connected around each of these transistors. Device theory indicates that transistor 70, 78 and 86 all switch on in these circumstances, doing so more or less simultaneously, as a result of the closing switch 95.

When the load side of supply 11 is in a relatively negative half cycle, device theory indicates that terminating region 89 of transistor 86 serves as the source for that transistor. When switch 95 is closed, the gate of transistor 86 is immediately put at a negative potential with respect to terminating region 89 because of energy source 94 acting through the parasitic diode connected to source 89 and because of the voltage divider action of resistors 91 and 92. As device theory indicates, transistor 86 is thus switched on upon the closing of switch 95.

Until the actual switching on of transistor 86, transistors 78 and 70 are not switched on by the closing of switch 95 because bias means 94 is not usually chosen to have a voltage value sufficient to bring the gates of these transitions more negative than the acting source regions 81 and 73, respectively, because of the voltage division occurring across these transistors when they are all off. So there is a momentary delay until these transistors switch on by virture of transistor 86 turning on and pulling terminating region 81 down to the voltage value appearing on the relatively positive side of supply 11. As this occurs, voltage from energy source 94 is applied through terminating regions 89 and 87 of transistor 86 to terminating region 81 of transistor 78 and through the parasitic diode connected thereto to provide a voltage divider action across resistors 83 and 84 forcing gate 82 to become relatively negative to the substrate connection 80. A similar sequence occurs with respect to transistor 70 as transistor 78 turns on. Thus, transistors, 86, 78 and 70 switch on upon the closing of switch 95 during times when the load side of supply 11 swings relatively negative.

Because of the symmetry in circuit layout of the circuit shown in FIG. 10, switch 95 and energy source 94 could just as well have been connected between the anode of diode 77 and terminating region 71 of transistor 70. Operation would be exactly as described for the circuit as shown in FIG. 10 but in opposite phases of the output voltage of supply 11.

In the configuration just described or in the one shown in FIG. 10, one end of the series combination of energy storage means 94 and switch means 95 is always connected to the common diode node. The other end of the combination is always connected to a transistor terminating region, either terminating region 71 of transistor 70 or to terminating region 89 of transistor 86. However, the same relative voltage relationships will occur in either configuration if one side of this series combination is connected to either the substrate connection 72 of transistor 70, rather than to region 71, or the substrate connection 88 of transistor 86 rather than region 89. Thus, the circuit operation would be essentially the same using these substrate connections as it would be having the series combination connected to the above described transistor terminating regions.

Figure 11:
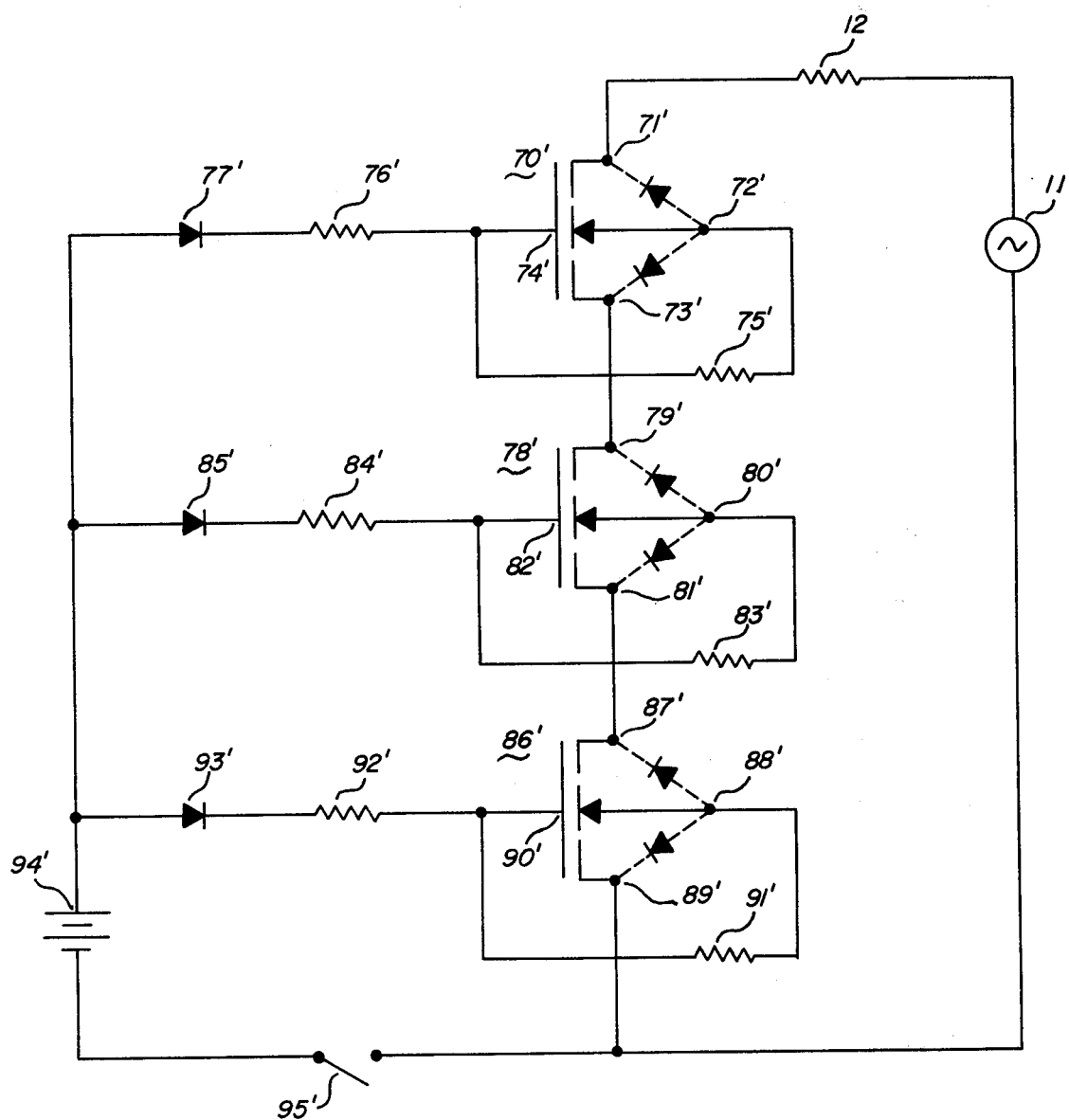
FIG. 11 shows a ninth embodiment of the circuit of the invention.

FIG. 11 shows, effectively, an enhancement mode, n-channel, MOSFET version of the circuit of FIG. 10. Again, operation of the FIG. 11 circuit will parallel the operation described above for the circuit shown in FIG. 10. Common components in these circuits have the same designations in FIGS. 10 and 11. Components of the circuit of FIG. 11 which have been replaced, or reversed in connection, have been indicated with the same number as they were in FIG. 10 with the addition of a prime symbol.

Figure 12:
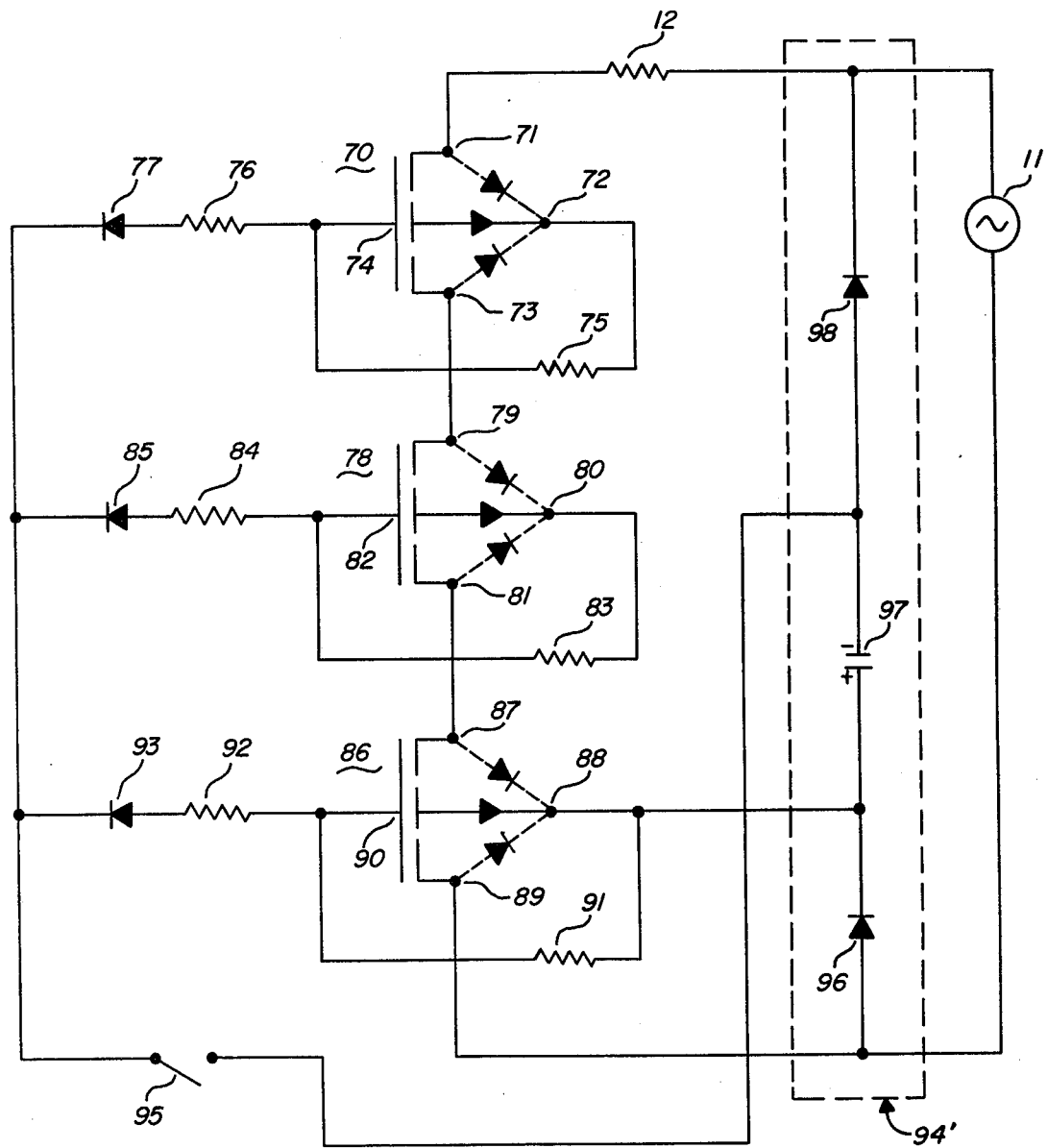
FIG. 12 shows a tenth embodiment of the circuit of the invention.

FIG. 12 shows an arrangement where energy source 94 is effectively placed on the opposite side of switch 95 from what was shown in FIG. 10, and at the same time the series combination of the energy storage means 94 and switch 95 are connected to substrate connection 88 of transistor 86. However, what was shown as energy storage means 94 in FIG. 10 (there indicated by a battery symbol) has been replaced by another storage means circuit 94', which includes a capacitor, 97, and a pair of diodes, 96 and 98.

Diodes 96 and 98, together with capacitor 97, effectively form a constant polarity power supply which is charged during those half cycles of the output voltage of supply 11 in which the load side of supply 11 is negative. The resulting positive voltage side of capacitor 97, serving as the energy storage means, is connected to substrate connection 88 of transistor 86. Operation of the circuit of FIG. 12, other than the addition of the charging of capacitor 97 and use of the connection to substrate 88, is just as described for the circuit shown in FIG. 10.

In all of the circuits 10, 11 and 12, it would be possible to eliminate the diodes in the gate lines if the resistors in series with them are sufficiently large. That is, for instance, diodes 77, 85 and 93 can be omitted in FIG. 10 if resistors 76, 84 and 92, respectively, were sufficiently large to serve as isolating means by themselves in view of the voltage divider ratio they form with the coupling resistors 75, 83 and 91. In the version shown in FIG. 10, typical resistance values for the resistors shown in the circuit of FIG. 10 are 10k ohms for resistors 76, 84 and 92, and 10k ohms for resistors 75, 83, and 91. Capacitor in FIG. 12 would typically be 50 $\mu f$.

Figure 13:
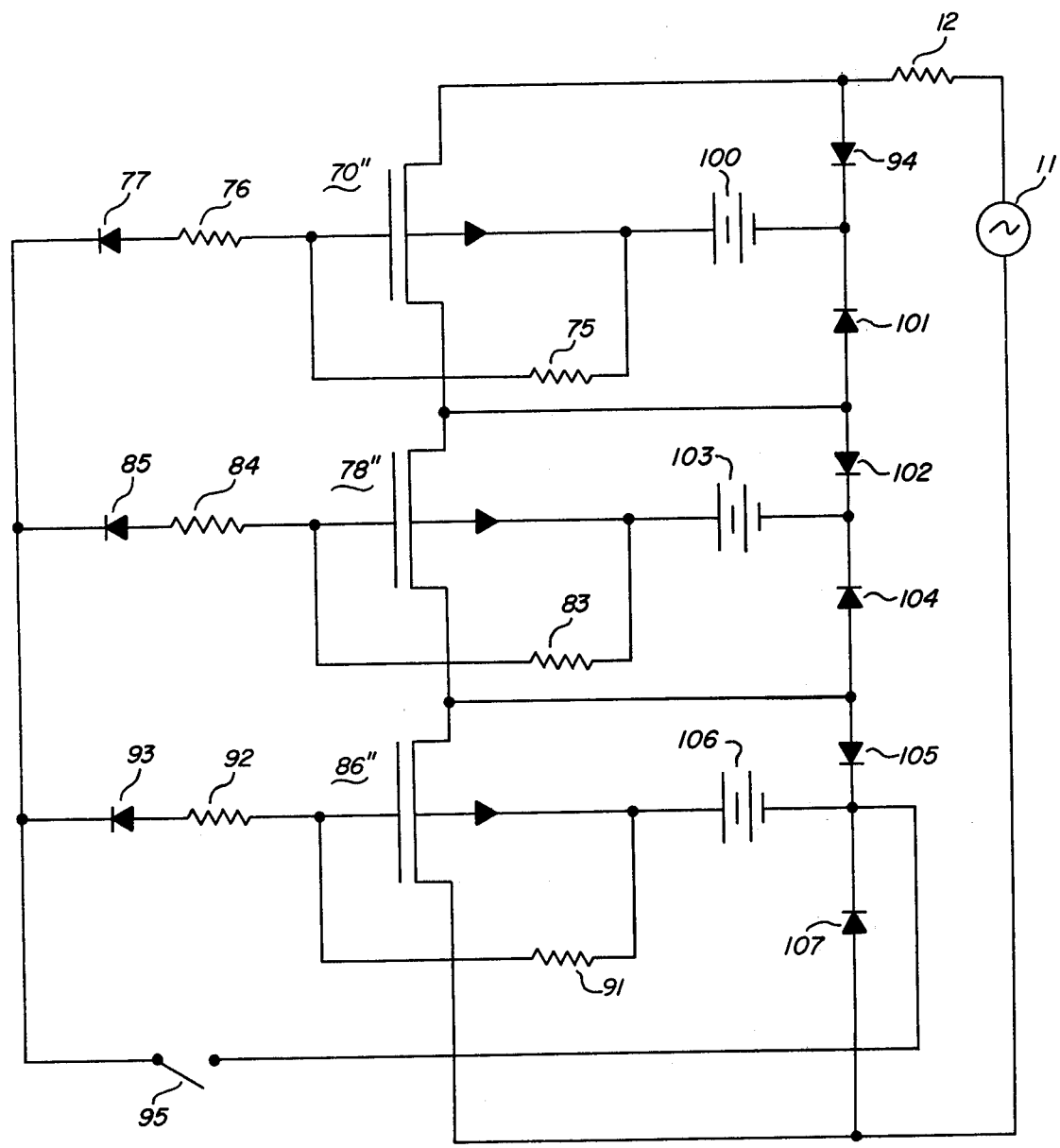
FIG. 13 shows an eleventh embodiment of the circuit of the invention.

Depletion mode versions are also available for the circuits shown in FIGS. 10 through 12; a depletion mode version of the FIG. 10 circuit being shown in FIG. 13. There, depletion mode, p-channel, MOS- FET's, 70", 78" and 86", are shown in place of the enhancement mode, p-channel transistors of FIG. 10. However, other common kinds of depletion mode transistors such as JFET's and MESFET's can also be used in such a circuit.

Added components are used in connection with each of these depletion mode transistors to bias them in the off condition to maintain similar circuit operation. Thus, a pair of diodes, 99 and 101, are used along with an energy storage means, 100, shown as a battery, to bias depletion mode transistor 70". Again, a pair of diodes, 102 and 104, are used along with an energy storage means, 103, shown as a battery, to bias depletion mode transistor 78". And finally, in a similar manner, a pair of diodes, 105 and 107 along with an energy storage means, 106, shown as a battery, are used to bias depletion mode transistor 86". The other components in the circuit of FIG. 13 which are common in the circuit of FIG. 10 retain the designations in FIG. 13 that they had in FIG. 10. The operation of the circuit in FIG. 13 is essentially that described for the operation of the circuit shown in FIG. 10.

Again, the circuits of FIGS. 10, 11, 12 and 13 must be operated at sufficiently low frequencies to prevent parasitics associated with the transistors therein from altering the operation of these circuits from what has been described above.

The embodiments of the invention in which an exclusive property or right is claimed are defined as follows:

1. An electronic switching circuit for controlling transfer of electrical power from an alternating polarity electrical power supply means to a load means, said switching circuit comprising:

a first transfer control field-effect device provided in and on a first substrate, said first transfer control field-effect device comprising:

a first transfer control field-effect device channel region located at least in part in a first selected region of said first substrate;

first transfer control field-effect device first and second terminating regions, separated by said first transfer control field-effect device channel region, into which and out of which primary currents through said first field-effect device can, at least in part, pass upon electrical energization of said first transfer control field-effect device first and second terminating regions, said first field-effect device first terminating region being electrically connected to a first terminal means adapted for electrical connection to a first circuit portion arrangement which includes both said alternating polarity electrical power supply means and said load means, and said first field-effect device second terminating region being electrically connected to a second terminal means adapted for electrical connection to said first circuit portion arrangement; and a first transfer control field-effect device gate region capable of affecting, upon electrical energization thereof, any current flow occurring through said first transfer control field-effect device channel region as a result of electrical energization of said first transfer control field-effect device first and second terminating regions;

an energy storage means having first and second polarity regions between which said energy storage means is capable of providing electrical energy storage, said energy storage means first polarity region being electrically connected to said first substrate;

a first unidirectional current conducting means having therein first and second terminating regions between which an asymmetrical current conducting capability is exhibited, said first unidirectional current conducting means first terminating region being electrically connected to said energy storage means second polarity region, and said first unidirectional current conducting means second terminating region being electrically connected to one of said first and second terminal means; and a control switch means capable, upon activation, of effectively electrically connecting said first transfer control field-effect device gate region to a selected one of (i) said first substrate, and (ii) said first unidirectional current conducting means first terminating region, whereby electrical power can be selectively transferred from said alternating polarity electrical power supply means to said load means in correspondence with said selection of electrical connection for said first transfer control field-effect device gate region.

2. The apparatus of claim 1 wherein a second unidirectional current conducting means is provided having therein first and second terminating regions between which an asymmetrical current conducting capability is exhibited, said second unidirectional current conducting means first terminating region being electrically connected to said first unidirectional current conducting means first terminating region, and said second unidirectional current conducting means second terminating region being electrically connected to that one of said first and second terminal means opposite that to which said first unidirectional current conducting means second terminating region is connected as aforesaid.

3. The apparatus of claim 1 wherein said first circuit portion arrangement comprises at least a portion of said load means being electrically connected to a third terminal means adapted for electrical connection to said alternating polarity electrical power supply means, and wherein one of said first and second terminal means is electrically connected to said portion of said load means, and wherein a second unidirectional current conducting means is provided having first and second terminating regions between which an asymmetrical current conducting capability is exhibited, said second unidirectional current conducting means first terminating region being electrically connected to said first unidirectional current conducting means first terminating region and said second unidirectional current conducting means second terminating region being electrically connected to said third terminal means.

4. The apparatus of claim 1 wherein said switch control means comprises first and second signal controlled field-effect transistors, each of said first and second signal controlled field-effect transistors having first and second terminating regions separated by channel regions and each having a gate region, said first signal controlled field-effect transistor second terminating region being electrically connected to both said second signal controlled field-effect transistor first terminating region and to said first transfer control field-effect device gate region, said first signal controlled field-effect transistor first terminating region being electrically connected to said first substrate and said second signal controlled field-effect transistor second terminating region being electrically connected to said first unidirectional current means first terminating region.

5. The apparatus of claim 1 wherein said energy storage means is a capacitance means.

6. The apparatus of claim 1 wherein said energy storage means is a means through which at least some electrical power can be supplied to said switching circuit from an electrical power source other than said alternating polarity electrical power supply means upon electrical energization of said energy storage means by said other source.

7. The apparatus of claim 1 wherein said circuit further comprises:
said first transfer control field-effect device being effectively an enhancement mode, n-channel, metal-oxide-semiconductor field-effect transistor (MOSFET), with said first transfer control field-effect device first and second terminating regions being source and drain regions therein, and with said first transfer control field-effect device gate region being separated from said first selected region of said first substrate by an insulating layer; and
said first unidirectional current conducting means being a first diode having an anode and a cathode, with first diode anode serving as said first unidirectional current conducting means second terminating region, and with said first diode cathode serving as said first unidirectional current conducting means first terminating region.

8. The apparatus of claim 1 wherein said circuit further comprises said first transfer control field-effect device being effectively a depletion mode, n-channel, field-effect transistor with said first transfer control field-effect device first and second terminating regions being source and drain regions therein.

9. The apparatus of claim 1 wherein said circuit further comprises:
said first transfer control field-effect device being effectively an enhancement mode, p-channel, metal-oxide-semiconductor field-effect transistor (MOSFET), with said first transfer control field-effect device first and second terminating regions being source and drain regions therein, and with said first transfer control field-effect device gate region being separated from said first selected region of said first substrate by an insulating layer; and
said first unidirectional current conducting means being a first diode having an anode and a cathode, with said first diode anode serving as said first unidirectional current conducting means first terminating region, and with said first diode cathode serving as said first unidirectional current conducting means second terminating region.

10. The apparatus of claim 1 wherein said circuit further comprises said first transfer control field-effect device being effectively a depletion mode, p-channel, field-effect transistor with said first transfer controlled field-effect device first and second terminating regions being source and drain regions therein.

11. The apparatus of claim 7 wherein a second unidirectional current conducting means is provided having therein first and second terminating regions between which an asymmetrical current conducting capability is exhibited, said second unidirectional current conducting means first terminating region being electrically connected to said first unidirectional current conducting means first terminating region, and said second unidirectional current conducting means second terminating region being electrically connected to that one of said first and second terminal means opposite that to which said first unidirectional current conducting means second terminating region is connected as aforesaid.

12. The apparatus of claim 7 wherein said first circuit portion arrangement comprises at least a portion of said load means being electrically connected to a third terminal means adapted for electrical connection to said alternating polarity electrical power supply means, and wherein one of said first and second terminal means is electrically connected to said portion of said load means, and wherein a second unidirectional current conducting means is provided having first and second terminating regions between which an asymmetrical current conducting capability means first terminating region being electrically connected to said first unidirectional current conducting capability is exhibited, said second unidirectional current conducting means first terminating region being electrically connected to said first unidirectional current conducting means first terminating region and said second unidirectional current conducting means second terminating region being electrically connected to said third terminal means.

13. The apparatus of claim 7 wherein said switch control means comprises first and second signal controlled field-effect transistors, each of said first and second signal controlled field-effect transistors having first and second terminating regions separated by channel regions and each having a gate region, said first signal controlled field-effect transistor second terminating region being electrically connected to both said second signal controlled field-effect transistor first terminating region and to said first transfer control field-effect device gate region, said first signal controlled field-effect transistor first terminating region being electrically connected to said first substrate and said second signal controlled field-effect transistor second terminating region being electrically connected to said first unidirectional current means first terminating region.

14. The apparatus of claim 7 wherein said energy storage means is a capacitance means.

15. The apparatus of claim 8 wherein said energy storage means is a means through which at least some electrical power can be supplied to said switching circuit from an electrical power source other than said alternating polarity electrical power supply means upon electrical energization of said energy storage means by said other source.

16. The appartus of claim 9 wherein a second unidirectional current conducting means is provided having therein first and second terminating regions between which an asymmetrical current conducting capability is exhibited, said second unidirectional current conducting means first terminating region being electrically connected to said first unidirectional current conducting means first terminating region, and said second unidirectional current conducting means second terminating region being electrically connected to that one of said first and second terminal means opposite that to which said first unidirectional current conducting means second terminating region is connected as aforesaid.

17. The apparatus of claim 9 wherein said first circuit portion arrangement comprises at least a portion of said load means being electrically connected to a third terminal means adapted for electrical connection to said alternating polarity electrical power supply means, and wherein one of said first and second terminal means is electrically connected to said portion of said load means, and wherein a second unidirectional current conducting means is rovided having first and second terminating regions between which an asymmetrical current conducting capability is exhibited, said second unidirectional current conducting means first terminating region being electrically connected to said first unidirectional current conducting means first terminating region and said second unidirectional current conducting means second terminating region being electrically connected to said third terminal means.

18. The apparatus of claim 9 wherein said switch control means comprises first and second signal controlled field-effect transistors, each of said first and second signal controlled field-effect transistors having first and second terminating regions separated by channel regions and each having a gate region, said first signal controlled field-effect transistor second terminating region being electrically connected to both said second signal controlled field-effect transistor first terminating region and to said first transfer control field-effect device gate region, said first signal controlled field-effect transistor first terminating region being electrically connected to said first substrate and said second signal controlled field-effect transistor second terminating region being electrically connected to said first unidirectional current means first terminating region.

19. The apparatus of claim 9 wherein said energy storage means is a capacitance means.

20. The apparatus of claim 10 wherein said energy storage means is a means through which at least some electrical power can be supplied to said switching circuit from an electrical power source other than said alternating polarity electrical power supply means upon electrical energization of said energy storage means by said other source.

21. The apparatus of claim 13 wherein said first and second signal controlled field-effect transistors are each provided in and on said first substrate.

22. The apparatus of claim 18 wherein said first and second signal controlled field-effect transistors are each provided in and on said first substrate.

23. An electronic switching circuit for controlling transfer of electrical power from an alternating polarity electrical power supply means to a load means, said switching circuit comprising:
  a first transfer control field-effect device provided in and on a first substrate, said first transfer control field-effect device comprising:
    a first transfer control field-effect device channel region located at least in part in a first selected region of said first substrate;
    first transfer control field-effect device first and second terminating regions, separated by said first transfer control field-effect device channel region, into which and out of which primary currents through said first field-effect device can, at least in part, pass upon electrical energization of said first transfer control field-effect device first and second terminating regions, said first field-effect device first terminating region being electrically connected to a first terminal means adapted for electrical connection to a first circuit portion arrangement, which includes both said alternating polarity electrical power supply means and said load means, and said first field-effect device second terminating region being electrically connected to a second terminal means adapted for electrical connection to said first circuit portion arrangement; and
    a first transfer control field-effect device gate region capable of affecting, upon electrical energization thereof, any current flow occurring through said first transfer control field-effect device channel region as a result of electrical energization of said first transfer control field-effect device first and second terminating regions;
  an energy storage means having first and second polarity regions between which said energy storage means is capable of providing electrical energy storage, said energy storage means first polarity region being electrically connected to said first substrate;
  a first unidirectional current conducting means having therein first and second terminating regions between which an asymmetrical current conducting capability is exhibited, said first unidirectional current conducting means first terminating region being electrically connected to said energy storage means second polarity region, and said first unidirectional current conducting means second terminating region being electrically connected to a third terminal means adapted for electrical connection to both said alternating polarity electrical power supply means and said load means; and
  a control switch means capable, upon activation, of effectively electrically connecting said first transfer control field-effect device gate region to a selected one of (i) said first substrate, and (ii) said first unidirectional current conducting means first terminating region, whereby electrical power can be selectively transferred from said alternating polarity electrical power supply means to said load means in correspondence with said selection of electrical connection for said first transfer control field-effect device gate region.

24. The apparatus of claim 23 wherein said switch control means comprises first and second signal controlled field-effect transistors, each of said first and second signal controlled field-effect transistors having first and second terminating regions separated by channel regions and each having a gate region, said first signal controlled field-effect transistor second terminating region being electrically connected to both said second signal controlled field-effect transistor first terminating region and to said first transfer control field-effect device gate region, said first signal controlled field-effect transistor first terminating region being electrically connected to said first substrate and said second signal controlled field-effect transistor second terminating region being electrically connected to said first unidirectional current means first terminating region.

25. The apparatus of claim 23 wherein said energy storage means is a capacitance means.

26. The apparatus of claim 23 wherein said energy storage means is a means through which at least some electrical power can be supplied to said switching circuit from an electrical power source other than said alternating polarity electrical power supply means upon electrical energization of said energy storage means by said other source.

27. The apparatus of claim 23 wherein said circuit further comprises:
    said first transfer control field-effect device being effectively an enhancement mode, n-channel, metal-oxide-semiconductor field-effect transistor (MOSFET), with said first transfer control field-effect device first and second terminating regions being source and drain regions therein, and with said first transfer control field-effect device gate region being separated from said first selected region of said first substrate by an insulating layer; and
    said first unidirectional current conducting means being a first diode having an anode and a cathode, with first diode anode serving as said first unidirectional current conducting means second terminating region, and with said first diode cathode serving as said first unidirectional current conducting means first terminating region.

28. The apparatus of claim 23 wherein said circuit further comprises said first transfer control field-effect device being effectively a depletion mode, n-channel, field-effect transistor with said first transfer control field-effect device first and second terminating regions being source and drain regions therein.

29. The apparatus of claim 23 wherein said circuit further comprises:
    said first transfer control field-effect device being effectively an enhancement mode, p-channel, metal-oxide-semiconductor field-effect transistor (MOSFET), with said first transfer control field-effect device first and second terminating regions being source and drain regions therein, and with said first transfer control field-effect device gate region being separated from said first selected region of said first substrate by an insulating layer; and
    said first unidirectional current conducting means being a first diode having an anode and a cathode, with said first diode anode serving as said first unidirectional current conducting means first terminating region, and with said first diode cathode serving as said first unidirectional current conducting means second terminating region.

30. The apparatus of claim 23 wherein said circuit further comprises said first transfer control field-effect device being effectively a depletion mode, p-channel, field-effect transistor with said first transfer controlled field-effect device first and second terminating regions being source and drain regions therein.

31. The apparatus of claim 27 wherein said switch control means comprises first and second signal controlled field-effect transistors, each of said first and second signal controlled field-effect transistors having first and second terminating regions separated by channel regions and each having a gate region, said first signal controlled field-effect transistor second terminating region being electrically connected to both said second signal controlled field-effect transistor first terminating region and to said first transfer control field-effect device gate region, said first signal controlled field-effect transistor first terminating region being electrically connected to said first substrate and said second signal controlled field-effect transistor second terminating region being electrically connected to said first unidirectional current means first terminating region.

32. The apparatus of claim 27 wherein said energy storage means is a capacitance means.

33. The apparatus of claim 28 wherein said energy storage means is a means through which at least some electrical power can be supplied to said switching circuit from an electrical power source other than said alternating polarity electrical power supply means upon electrical energization of said energy storage means by said other source.

34. The apparatus of claim 29 wherein said switch control means comprises first and second signal controlled field-effect transistors, each of said first and second signal controlled field-effect transistors having first and second terminating regions separated by channel regions and each having a gate region, said first signal controlled field-effect transistor second terminating region being electrically connected to both said second signal controlled field-effect transistor first terminating region and to said first transfer control field-effect device gate region, said first signal controlled field-effect transistor first terminating region being electrically connected to said first substrate and said second signal controlled field-effect transistor second terminating region being electrically connected to said first unidirectional current means first terminating region.

35. The apparatus of claim 29 wherein said energy storage means is a capacitance means.

36. The apparatus of claim 30 wherein said energy storage means is a means through which at least some electrical power can be supplied to said switching circuit from an electrical power source other than said alternating polarity electrical power supply means upon electrical energization of said energy storage means by said other source.

37. The apparatus of claim 31 wherein said first and second signal controlled field-effect transistors are each provided in and on said first substrate.

38. The apparatus of claim 34 wherein said first and second signal controlled field-effect transistors are each provided in and on said first substrate.

39. An electronic switching circuit for controlling transfer of electrical power from an alternating polarity electrical power supply means to a load means, said switching circuit comprising:
    a first transfer control field-effect device provided in and on a first substrate, said first transfer control field-effect device comprising:
        a first transfer control field-effect device channel region located at least in part in a first selected region of said first substrate;
        first transfer control field-effect device first and second terminating regions, separated by said first transfer control field-effect device channel region, into which and out of which primary currents through said first transfer control field-effect device can, at least in part, pass upon electrical energization of said first transfer control field-effect device first and second terminating regions, said first transfer control field-effect device first terminating region being electrically connected to a first terminal means adapted for electrical connection to one of said alternating polarity electrical power supply means and said load means, and said first transfer control field-effect device second terminating region being electrically connected to a second terminal means adapted for electrical connection to that one of said alternating polarity electrical power supply means and said load means opposite that to which said first terminal means is adapted for connection to as aforesaid; and a first transfer control field-effect device gate region capable of affecting, upon electrical energization thereof, any current flow occurring through said first transfer control field-effect device channel region as a result of electrical energization of said first transfer control field-effect device first and second terminating regions;

a first signal controlled field-effect device provided in and on a second substrate, said first signal controlled field-effect device comprising:

a first signal controlled field-effect device channel region located at least in part in a first selected region of said second substrate, said second substrate being electrically connected to said first substrate;

first signal controlled field-effect device first and second terminating regions, separated by said first signal controlled field-effect device channel region, into which and out of which primary currents through said first signal controlled field-effect device can, at least in part, pass upon electrical energization of said first signal controlled field-effect device first and second terminating regions, said first signal controlled field-effect device first terminating region being electrically connected to said first transfer control field-effect device gate region; and a first signal controlled field-effect device gate region capable of affecting, upon electrical energization thereof, any current flow occurring through said first signal controlled field-effect device channel region as a result of electrical energization of said first signal controlled field-effect device first and second terminating regions, said first signal controlled field-effect device gate region being electrically connected to a third terminal means adapted for electrical connection to both said alternating polarity electrical supply means and said load means; and a bias control means having a first location therein and a second location therein, said bias control means being capable of selectively providing a bias voltage between said first and second locations therein upon electrical energization of said bias control means, said bias control means first location being electrically connected to said first signal controlled field-effect transistor second terminating region and said bias control means second location being electrically connected to said first transfer control field-effect device, whereby electrical power can be selectively transferred from said alternating polarity electrical power supply means to said load means in correspondence with said selective providing of said bias voltage between said bias control means first and second locations.

40. The apparatus of claim 39 wherein at least a part of said load means is electrically connected to a fourth terminal means adapted for connection to said alternating polarity electrical power supply means, and wherein one of said first and second terminal means is electrically connected to said first portion of said load means and said third terminal means includes said fourth terminal means.

41. The apparatus of claim 39 wherein said circuit further comprises said first transfer control field-effect device being effectively an enhancement mode, n-channel, metal-oxide-semiconductor field-effect transistor (MOSFET), with said first transfer control field-effect device first and second terminating regions being source and drain regions therein, and with said first transfer control field-effect device gate region being separated from said first selected region of said first substrate by an insulating layer.

42. The apparatus of claim 39 wherein said circuit further comprises said first transfer control field-effect device being effectively a depletion mode, n-channel, field-effect transistor, with said first transfer control field-effect device first and second terminating regions being source and drain regions therein.

43. The apparatus of claim 39 wherein said circuit further comprises said first transfer control field-effect device being effectively an enhancement mode, p-channel, metal-oxide-semiconductor field-effect transistor (MOSFET), with said first transfer control field-effect device first and second terminating regions being source and drain regions therein, and with said first transfer control field-effect device gate region being separated from said first selected region of said first substrate by an insulating layer.

44. The apparatus of claim 39 wherein said circuit further comprises said first transfer control field-effect device being effectively a depeletion mode, p-channel, field-effect transistor, with said first transfer control field-effect device first and second terminating regions being source and drain regions therein.

45. The apparatus of claim 39 wherein said bias control means second location is electrically connected to one of said first transfer control field-effect device first and second terminating regions.

46. The apparatus of claim 39 wherein said bias control means second location is electrically connected to said first substrate.

47. The apparatus of claim 39 wherein said first and second substrates are a common substrate.

48. The apparatus of claim 43 wherein said bias control means second location is electrically connected to one of said first transfer control field-effect device first and second terminating regions and wherein said first and second substrates are a common substrate.

49. An electronic switching circuit for controlling transfer of electrical power from alternating polarity electrical power supply means to a load means, said switching circuit comprising:

a set of transfer control field-effect devices each provided in and on one of a corresponding set of substrates from among which a $k^{th}$ said field-effect device is provided in and on a corresponding $k^{th}$ said substrate where $1 \leq k \leq n$ and $n \geq 2$, a $k^{th}$ one of said set of transfer control field-effect devices comprising:

a $k^{th}$ transfer control field-effect device channel region located, at least in part, in a first selected region of said corresponding $k^{th}$ substrate;

$k^{th}$ transfer control field-effect device first and second terminating regions, separated by said $k^{th}$ transfer control field-effect device channel region, into which and out of which primary currents through said $k^{th}$ transfer control field-effect device can, at least in part, pass upon electrical energization of said $k^{th}$ transfer control field-effect device first and second terminating regions, said $k^{th}$ field-effect device second terminating region being electrically connected to a (k+1)$^{th}$ said field-effect device first terminating region except for a first (k=1) said field-effect device first terminating region being electrically connected to a first terminal means adapted for electrical connection to a first circuit portion arrangement which includes both said alternating polarity electrical power supply means and said load means, and except for a last (k=n) said field-effect device second terminating region being electrically connected to a second terminal means adapted for electrical connection to said first circuit portion arrangement; and a k$^{th}$ transfer control field-effect device gate region capable of affecting, upon electrical energization thereof, any current flow occurring through said k$^{th}$ transfer control field-effect device channel region as a result of electrical energization of said k$^{th}$ transfer control field-effect device first and second terminating regions;

a set of n conductive connector means each of which is such that a k$^{th}$ one of said set of connector means is correspondingly electrically connected between a k$^{th}$ said transfer control field-effect device substrate and a k$^{th}$ said transfer control field-effect device gate region;

a bias control means having a first location therein and a second location therein, said bias control means being capable of selectively providing a bias voltage between said first and second locations therein upon electrical energization of said bias control means, said bias control means second location being electrically connected to one of said first (k=1) to last (k−n) transfer control field-effect devices; and a set of n isolation means each of which is provided such that a k$^{th}$ one of said set of isolation means is correspondingly electrically connected between said bias control means first location and a k$^{th}$ said transfer control field-effect device gate region, each said isolation means being capable, if placed in series with its corresponding connection means and electrically energized jointly therewith, of preventing a significant voltage drop from occurring across said corresponding connection means, whereby electrical power can be selectively transferred from said alternating polarity electrical power supply means to said load means in correspondence with said selected providing of said bias voltage between said bias control means first and second locations.

50. The apparatus of claim 49 wherein at least a part of said load means is electrically connected to a third terminal means adapted for connected to said alternating polarity electrical power supply means, and wherein said bias control means further comprises:

an energy storage means having first and second polarity regions between which said energy storage means is capable of providing electrical energy storage, said energy storage means first polarity region being electrically connected to said bias control means second location;

a first unidirectional current conducting means having therein first and second terminating regions between which an asymmetrical current conducting capability is exhibited, said first unidirectional current conducting means first terminating region being electrically connected to a selected one of said first and second terminal means, said first unidirectional current conducting means second terminating region being electrically connected to said energy storage means first polarity region;

a second unidirectional current conducting means having therein first and second terminating regions between which an asymmetrical current conducting capability is exhibited, said second unidirectional current conducting means first terminating region being electrically connected to said energy storage means second polarity region, said second unidirectional current conducting means second terminating region being electrically connected to said third terminal means; and a switch means capable, upon activation, of electrically connecting said bias control means first location to a selected one of said energy storage means first and second polarity regions.

51. The apparatus of claim 49 wherein said bias control means second location being electrically connected to said first transfer control field-effect device first terminating region.

52. The apparatus of claim 49 wherein said bias control means second location being electrically connected to said first transfer control field-effect device substrate.

53. The apparatus of claim 49 wherein said bias control means second location being electrically connected to said last transfer control field-effect device second terminating region.

54. The apparatus of claim 49 wherein said bias control means second location being electrically connected to said last transfer control field-effect device substrate.

55. The apparatus of claim 49 wherein said circuit further comprises:

each of said set of transfer control field-effect devices being effectively an enhancement mode, n-channel, metal-oxide-semiconductor field-effect transistor (MOSFET) with its first and second terminating regions being source and drain regions therein, and with its gate region being separated from its corresponding said selected region of its said corresponding substrate by an insulating layer; and said set of isolation means each being a diode having an anode and a cathode with each anode thereof being electrically connected to said bias control means first location.

56. The apparatus of claim 49 wherein said circuit further comprises said set of transfer control field-effect devices each being effectively a depletion mode, pn-channel field-effect transistor with its first and second terminating regions being source and drain regions therein.

57. The apparatus of claim 49 wherein said circuit further comprises:

each of said set of transfer control field-effect devices being effectively an enhancement mode, p-channel, metal-oxide-semiconductor field-effect transistor (MOSFET) with its first and second terminating regions being source and drain regions therein, and with gate region being separated from its corresponding said selected region of its said corresponding substrate by an insulating layer; and said set of isolation means each being a diode having an anode and a cathode with each cathode thereof being electrically connected to said bias control means first location.

58. The apparatus of claim 49 wherein said circuit further comprises said set of transfer control field-effect devices each being effectively a depletion mode, p-channel, field-effect transistor, with its first and second terminating regions being source and drain regions therein.

* * * * *